United States Patent
Kitajima et al.

(10) Patent No.: US 10,672,739 B2
(45) Date of Patent: Jun. 2, 2020

(54) POWER CONVERSION DEVICE

(71) Applicant: Mitsubishi Electric Corporation, Tokyo (JP)

(72) Inventors: Yumie Kitajima, Tokyo (JP); Shota Saito, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/087,971

(22) PCT Filed: May 2, 2016

(86) PCT No.: PCT/JP2016/063526
§ 371 (c)(1),
(2) Date: Sep. 24, 2018

(87) PCT Pub. No.: WO2017/191667
PCT Pub. Date: Nov. 9, 2017

(65) Prior Publication Data
US 2019/0109116 A1    Apr. 11, 2019

(51) Int. Cl.
| | | |
|---|---|---|
| *H01L 25/065* | (2006.01) | |
| *H01L 23/367* | (2006.01) | |
| *H02M 7/00* | (2006.01) | |
| *H02M 1/00* | (2006.01) | |
| *H02M 7/48* | (2007.01) | |
| *H02M 7/5387* | (2007.01) | |
| *H02P 27/06* | (2006.01) | |

(52) U.S. Cl.
CPC ........ *H01L 25/0655* (2013.01); *H01L 23/367* (2013.01); *H02M 1/00* (2013.01); *H02M 7/003* (2013.01); *H02M 7/48* (2013.01); *H02M 7/5387* (2013.01); *H02P 27/06* (2013.01)

(58) Field of Classification Search
CPC .. H01L 25/0655; H01L 23/367; H02M 7/003; H02M 7/5387; H02P 27/06
USPC .......................................... 257/723
See application file for complete search history.

(56) References Cited

U.S. PATENT DOCUMENTS

2008/0291628 A1* 11/2008 Aoki .................. H01L 23/473
361/699
2010/0127371 A1* 5/2010 Tschirbs .................. H01L 23/13
257/684
2014/0361424 A1 12/2014 Horio et al.

FOREIGN PATENT DOCUMENTS

JP    2004-208411 A    7/2004
JP    2005-057864 A    3/2005
(Continued)

OTHER PUBLICATIONS

International Search Report issued in PCT/JP2016/063526; dated Jul. 26, 2016.
(Continued)

*Primary Examiner* — Tong-Ho Kim
(74) *Attorney, Agent, or Firm* — Studebaker & Brackett PC

(57) ABSTRACT

A first member of a first semiconductor module and a second member of a second semiconductor module are disposed adjacent to each other along a crossing line segment crossing a longitudinal direction of the first semiconductor module as seen in a plan view. The first member is provided with a first circuit. The second member is provided with a second circuit. The first circuit does not drive when the second circuit is driving. The second circuit does not drive when the first circuit is driving.

9 Claims, 11 Drawing Sheets

(56) References Cited

FOREIGN PATENT DOCUMENTS

| | | |
|---|---|---|
| JP | 2013-236476 A | 11/2013 |
| JP | 2014-192812 A | 10/2014 |
| WO | 2013/145620 A1 | 10/2013 |

OTHER PUBLICATIONS

An Office Action mailed by the Japanese Patent Office dated Mar. 12, 2019, which corresponds to Japanese Patent Application No. 2018-515368 and is related to U.S. Appl. No. 16/087,971.

An Office Action issued by the Patent office of the People's Republic of China dated Jan. 16, 2020, which corresponds to Chinese Patent Application No. 201680085029.1 and is related to U.S. Appl. No. 16/087,971 with English language translation.

\* cited by examiner

F I G. 5A
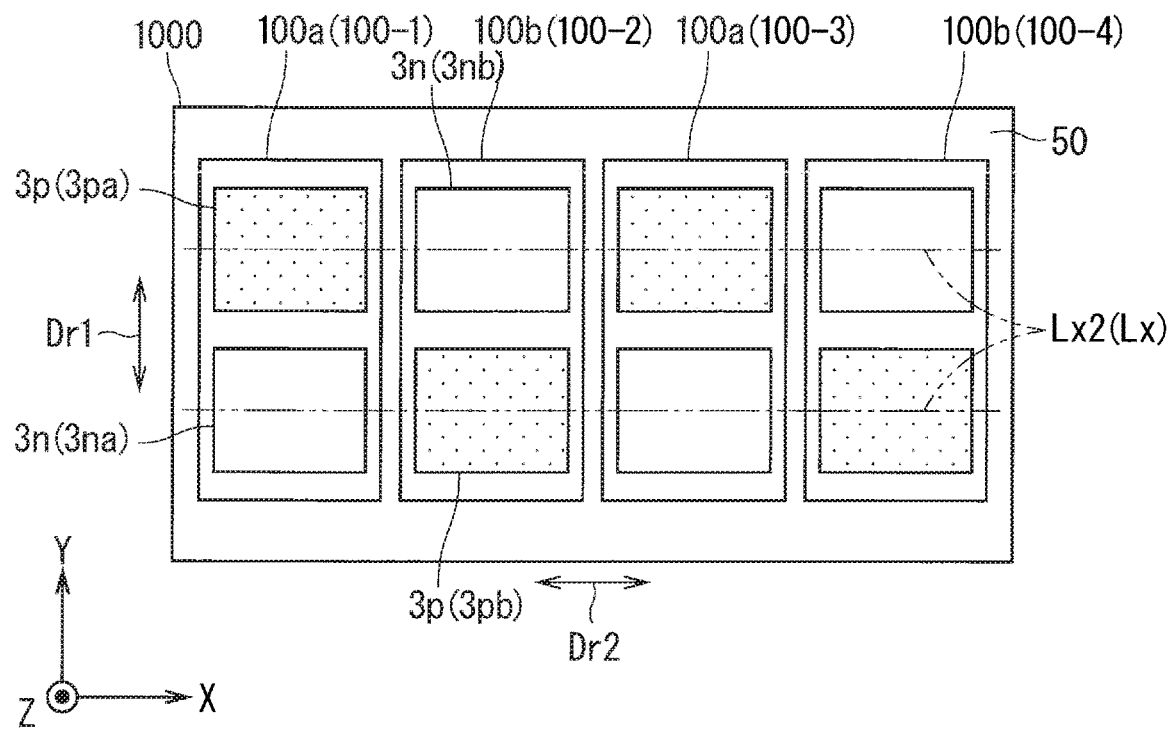
F I G. 5B
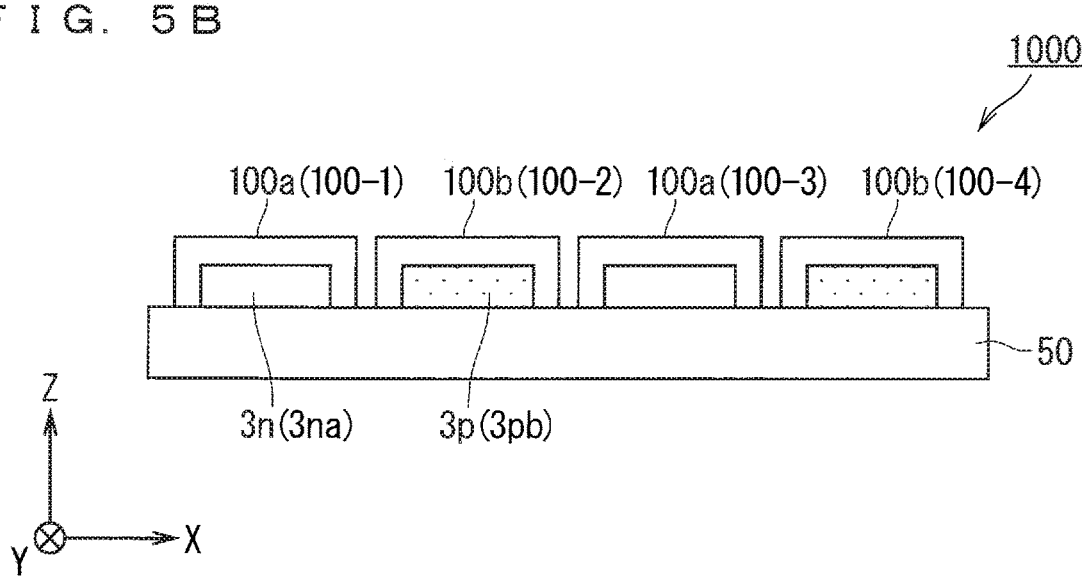

POWER CONVERSION DEVICE

TECHNICAL FIELD

The present invention relates to a power conversion device having a structure in which the heat dissipation property is taken into consideration.

BACKGROUND ART

Recent years have seen an increase in environmentally sensitive power generation systems that generate power using natural energy. The natural energy includes sunlight, wind force, tide and the like. In a power conversion device or the like used in such a power generation system, a power semiconductor module is used. That is, the power semiconductor module is used in various environments. Accordingly, the power semiconductor module is demanded of, in addition to increased current and raised withstanding voltage, customizability corresponding to the usage, reduced space and the like.

Conventionally, the power semiconductor module included in the power conversion device is structured by one element for obtaining the target rated current. That is, as to the conventional power semiconductor module, it has not been contemplated using a combination of plurality of elements. Accordingly, as to the conventional power semiconductor module, out of a limited number of elements with which the rated current can be obtained, an element capable of obtaining the desired rated current is selected, and the element is put to use.

Therefore, the conventional power semiconductor module has various problems. The problems include, for example, a problem that space greater than necessary is required in the power conversion device in order to mount a heat dissipation plate inside that power conversion device. Further, the problems include, for example, a problem of poor heat dissipation property attributed to concentration of heat to a certain location in the power conversion device depending on the operation condition of the element.

In an attempt to solve such problems, a parallel-drive-type semiconductor module is coming into use. For example, Patent Document 1 discloses the technique of using a semiconductor module in which a plurality of switches are driven in parallel (hereinafter also referred to as the "related art A"). Further, Patent Document 2 discloses the technique of driving a plurality of semiconductor modules in parallel (hereinafter also referred to as the "related art B").

PRIOR ART DOCUMENTS

Patent Documents

Patent Document 1: Japanese Patent Application Laid-Open No. 2005-057864
Patent Document 2: WO 2013/145620

SUMMARY

Problem to be Solved by the Invention

The related arts A, B each disclose the structure of selectively driving a plurality of circuits (hereinafter also referred to as the "structure Ctz"). In particular, the related art B discloses the structure of driving a plurality of semiconductor modules each having the structure Ctz in parallel (hereinafter also referred to as the "structure Ctzb").

Recently, there exists demand for a downsized power conversion device having the structure Ctzb. In order to meet the demand, the heat dissipation property of the power conversion device must be excellent while an increase in size of the region required for disposing the plurality of semiconductor modules is suppressed. Note that, while the related art B discloses the structure in which the interval of the adjacent ones of the plurality of semiconductor modules is adjustable, the structure still fails to meet the demand.

The present invention has been made in order to solve the above-described problems, and an object thereof is to provide a power conversion device with excellent heat dissipation property while an increase in size required for disposing a plurality of semiconductor modules is suppressed.

Means to Solve the Problem

In order to achieve the above-stated object, a power conversion device according to one embodiment of the present invention includes k (an integer equal to or greater than 2)-pieces of semiconductor modules, wherein each of the k-pieces of semiconductor modules includes: a first member provided with a first circuit; and a second member provided with a second circuit, wherein the first circuit and the second circuit are electrically connected to each other, the first circuit does not drive when the second circuit is driving, the second circuit does not drive when the first circuit is driving, a shape of each of the semiconductor modules is elongated as seen in a plan view, the first member and the second member of each of the semiconductor modules are disposed adjacent to each other along a first direction being a longitudinal direction of the semiconductor module as seen in a plan view, the k-pieces of semiconductor modules include a first semiconductor module and a second semiconductor module disposed adjacent to each other, and the first member of the first semiconductor module and the second member of the second semiconductor module are disposed adjacent to each other along a crossing line segment being a line segment crossing the first direction as seen in a plan view.

Effects of the Invention

According to the present invention, the first member of the first semiconductor module and the second member of the second semiconductor module are disposed adjacent to each other along a crossing line segment that crosses the first direction as seen in a plan view.

Thus, it becomes possible to suppress an increase in size of the region required for disposing the first semiconductor module and the second semiconductor module.

Further, a first member is provided with a first circuit. A second member is provided with a second circuit. The first circuit does not drive when the second circuit is driving. The second circuit does not drive when the first circuit is driving.

Therefore, when the second circuit is driving, to that second circuit generating heat, the first circuit that is not driving is adjacent. Accordingly, the heat dissipation property of the power conversion device improves.

From the foregoing, it becomes possible to provide the power conversion device with excellent heat dissipation property while an increase in size of the region required for disposing a plurality of semiconductor modules is suppressed.

These and other objects, features, aspects and advantages of the present invention will become more apparent from the following detailed description of the present invention when taken in conjunction with the accompanying drawings.

BRIEF DESCRIPTION OF DRAWINGS

FIGS. 5A and 5B are illustrations for describing the disposition structure of a plurality of semiconductor modules according to the first embodiment of the present invention.

DESCRIPTION OF EMBODIMENTS

Figure 1:
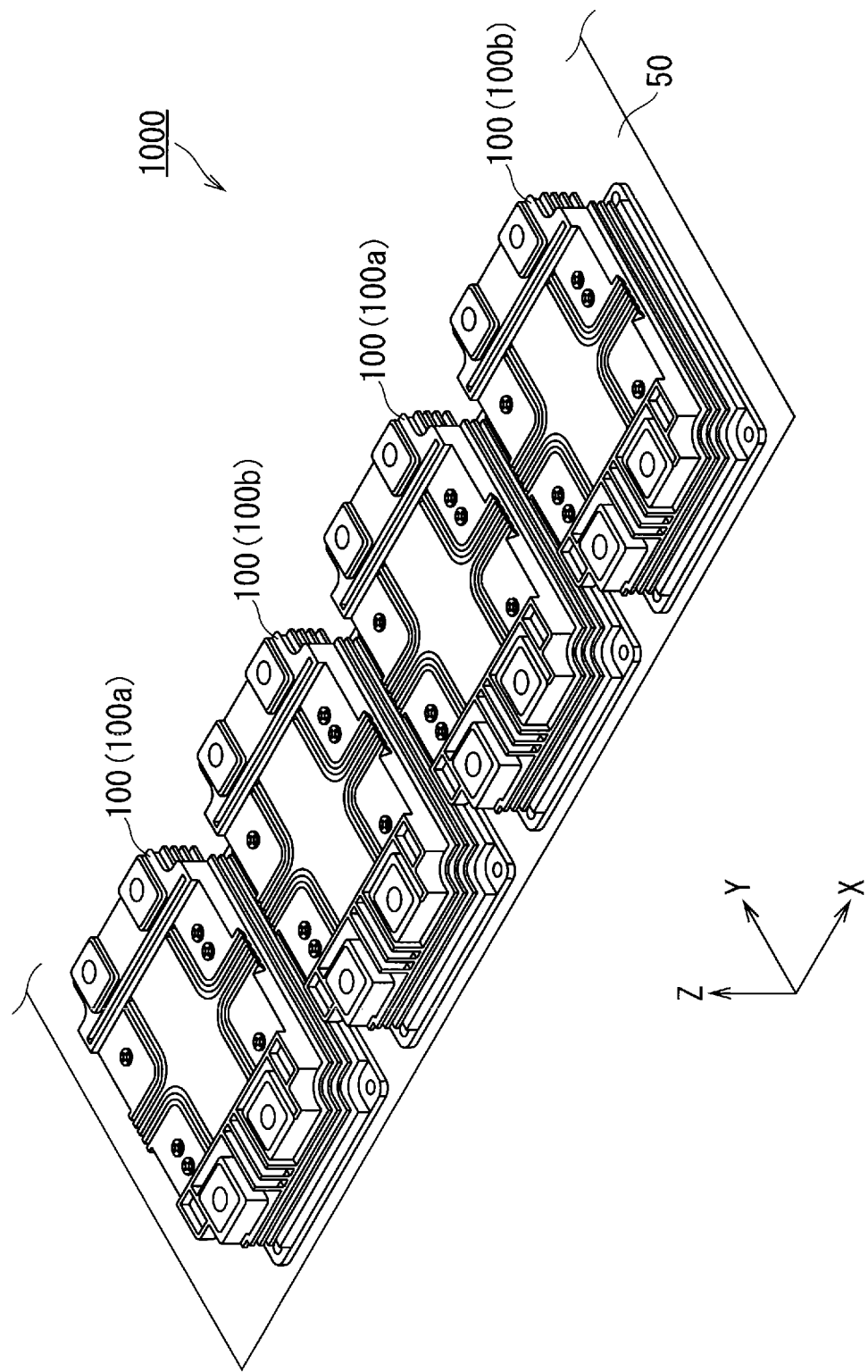
FIG. 1 is a perspective view of the internal structure of a power conversion device according to a first embodiment of the present invention.

In the following, with reference to the drawings, a description will be given of embodiments of the present invention. In the drawings referred to in the following, an identical constituent component is denoted by an identical reference character. Those constituent components denoted by an identical reference character are the same in name and function. Accordingly, a detailed description may be omitted as to part of such constituent components denoted by an identical reference character.

Note that, the dimension, material, shape of each of the constituent components exemplarily shown in the embodiments and the relative disposition of the constituent components may be changed as appropriate depending on the structure, various conditions and the like of the device to which the present invention is applied. Further, the dimension of each of the constituent components in the drawings may differ from the actual dimension.

First Embodiment

FIG. 1 is a perspective view showing the internal structure of a power conversion device 1000 according to a first embodiment of the present invention. The power conversion device 1000 is, for example, a device that converts AC power into DC power.

In FIG. 1, an X direction, a Y direction, and a Z direction are perpendicular to each other. In the subsequent drawings also, the X direction, the Y direction, and the Z direction are perpendicular to one another. Hereinafter, a direction including the X direction and a direction opposite to the X direction (−X direction) is also referred to as the "X-axis direction". Further, hereinafter, a direction including the Y direction and a direction opposite to the Y direction (−Y direction) is also referred to as the "Y-axis direction". Still further, hereinafter, a direction including the Z direction and a direction opposite to the Z direction (−Z direction) is also referred to as the "Z-axis direction".

Further, hereinafter, a plane including the X-axis direction and the Y-axis direction is also referred to as the "XY plane". Still further, hereinafter, a plane including the X-axis direction and the Z-axis direction is also referred to as the "XZ plane". Still further, hereinafter, a plane including the Y-axis direction and the Z-axis direction is also referred to as the "YZ plane".

With reference to FIG. 1, the power conversion device 1000 includes a heat dissipation plate 50, k-pieces of semiconductor modules 100, and a power supply Pw1 (not shown). "k" is an integer equal to or greater than 2. As an example, "k" is 4 in the present embodiment. Therefore, FIG. 1 shows four semiconductor modules 100 as an example. Note that, the number of the semiconductor module 100 included in the power conversion device 1000 is not limited to four, and may be two, three, or five or more.

The heat dissipation plate 50 is a plate for dissipating heat. The power supply Pw1 supplies power to any constituent component included in the power conversion device 1000 (for example, a circuit Cr10 which will be described later).

Each of the semiconductor modules 100 is provided on the heat dissipation plate 50. The semiconductor modules 100 is, for example, a power semiconductor module including an IGBT (Insulated Gate Bipolar Transistor). The semiconductor module 100 is, for example, an inverter.

Figure 2:
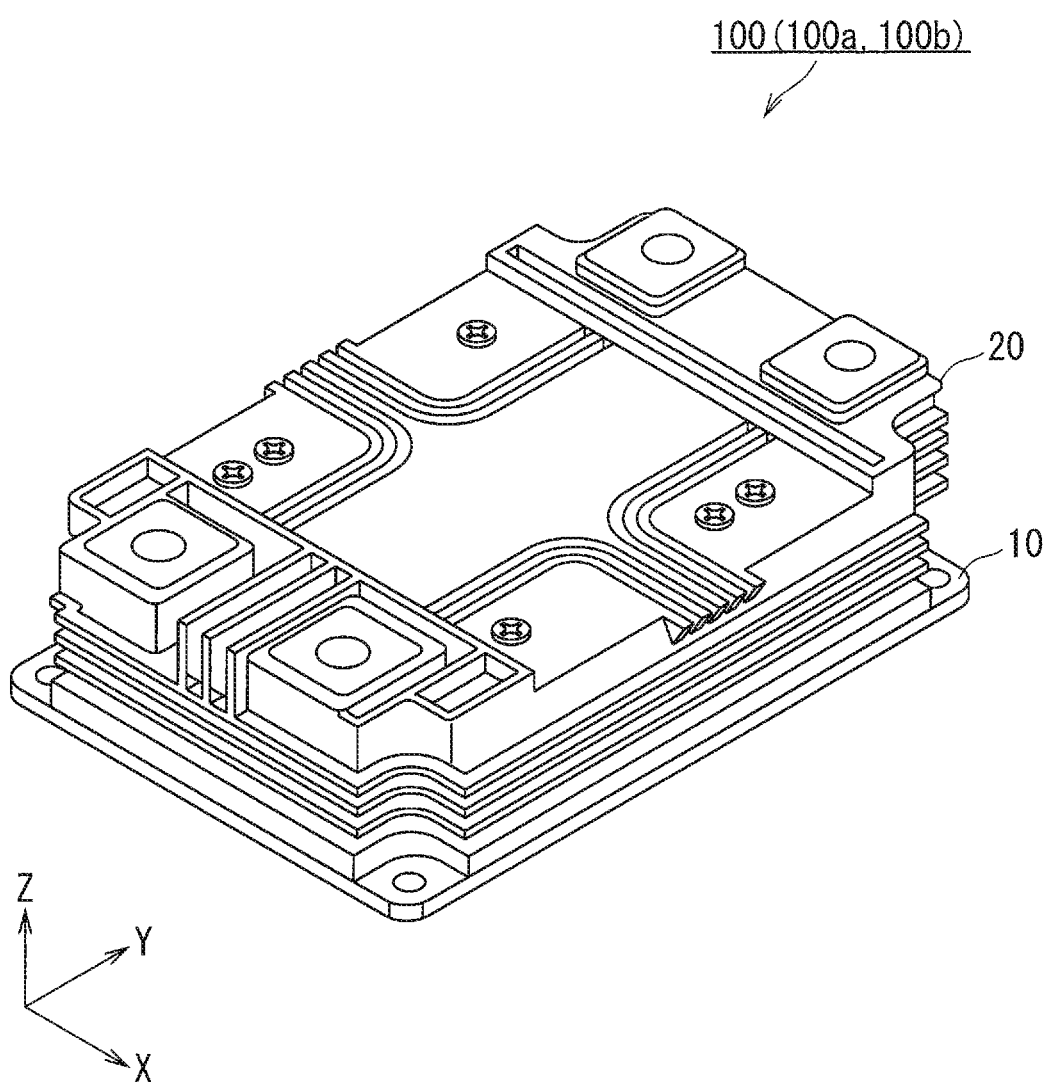
FIG. 2 is a perspective view showing the appearance of a semiconductor module according to the first embodiment of the present invention.

FIG. 2 is a perspective view showing the appearance of the semiconductor module 100 according to the first embodiment of the present invention. The semiconductor module 100 includes a base plate 10 and a housing 20. The base plate 10 is provided on the heat dissipation plate 50. The base plate 10 is a substrate on which a circuit is provided. The base plate 10 is structured by, for example, metal or the like.

The housing 20 is provided on the base plate 10. That is, the base plate 10 corresponds to the bottom part of the semiconductor module 100. The housing 20 houses the circuit and the like provided on the base plate 10. The housing 20 is structured by, for example, resin or the like.

The semiconductor module 100 according to the present embodiment has one of two types of structures. Hereinafter, the semiconductor module 100 having one of the two types of structures is also referred to as the "semiconductor module 100a". Further, hereinafter, the semiconductor module 100 having other one of the two types of structures is also referred to as the "semiconductor module 100b".

Figure 3A:
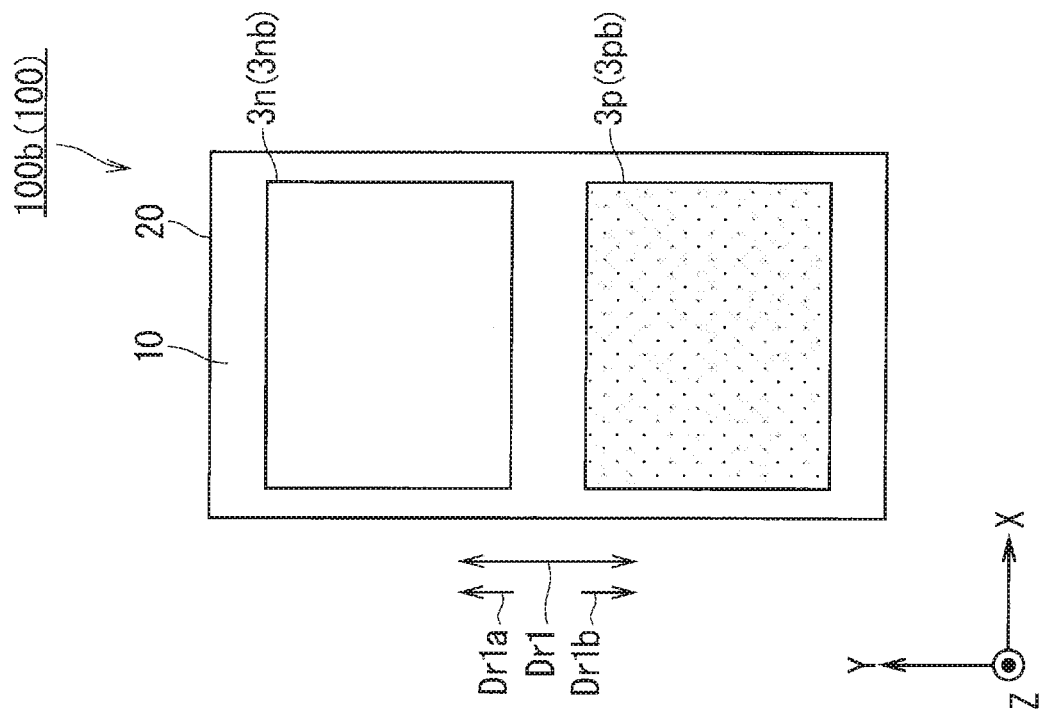
FIGS. 3A and 3B are plan views for describing two types of semiconductor modules according to the first embodiment of the present invention.
Figure 3B:
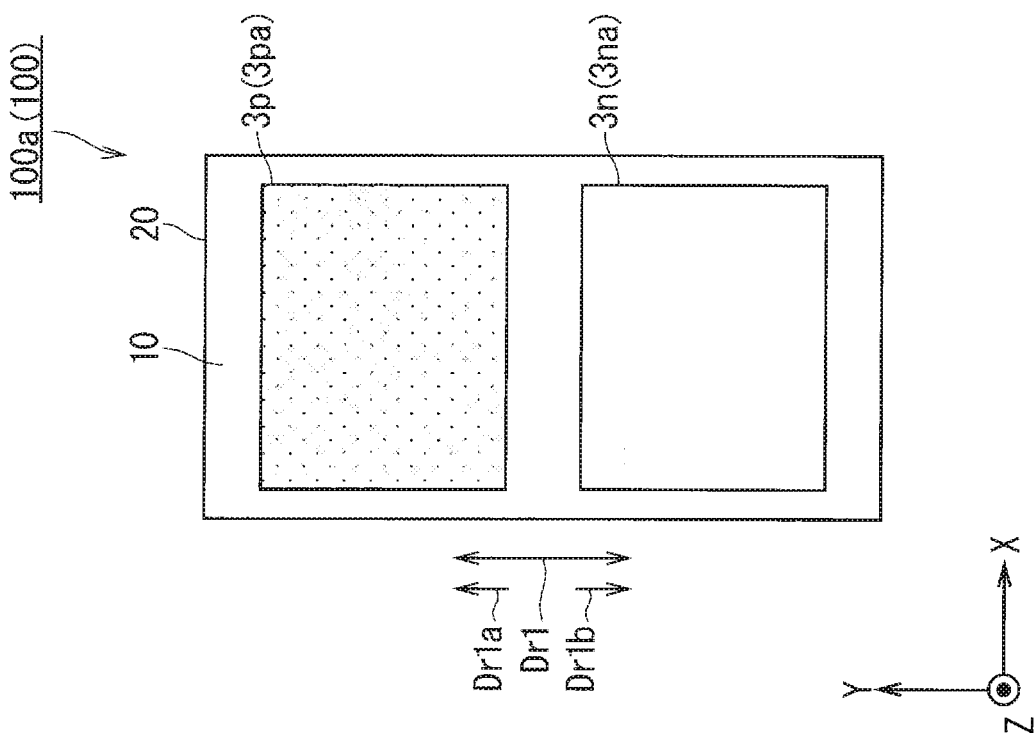

FIGS. 3A and 3B are plan views for describing two types of semiconductor modules 100 according to the first embodiment of the present invention. FIG. 3A is a plan view showing the schematic structure of the semiconductor module 100a. FIG. 3B is a plan view showing the schematic structure of the semiconductor module 100b. Note that, for the sake of easier understanding of the structure, FIG. 3A and FIG. 3B show just the contour line of the housing 20.

With reference to FIG. 3A and FIG. 3B, the semiconductor module 100 being the semiconductor module 100a or the semiconductor module 100b further includes a P-side substrate 3p and an N-side substrate 3n. The P-side substrate 3p and the N-side substrate 3n are each an insulating substrate. The P-side substrate 3p and the N-side substrate 3n are provided on the base plate 10.

Figure 4:
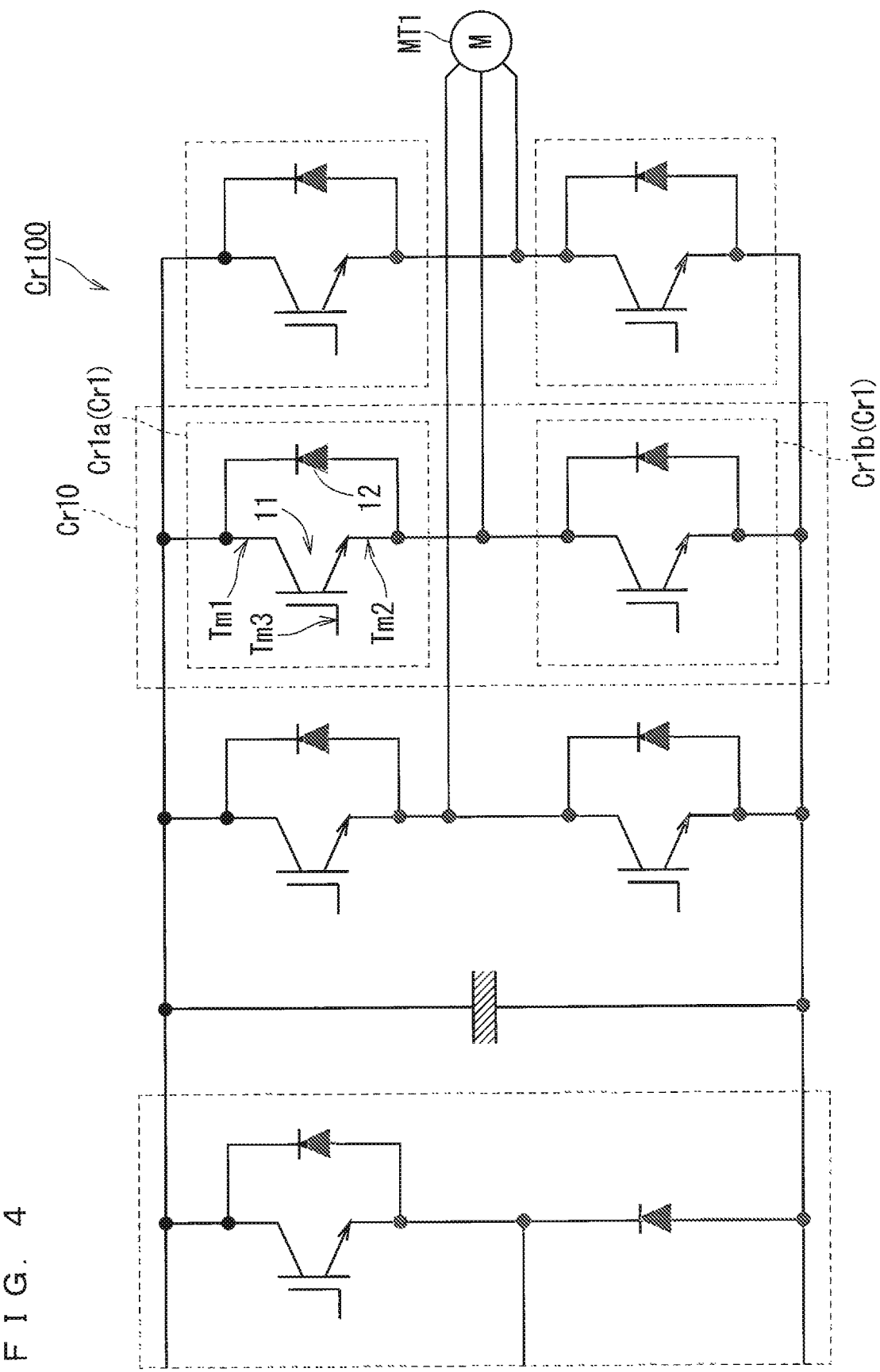
FIG. 4 is an illustration showing a circuit for driving a motor.

The semiconductor module 100 further includes a circuit Cr10. FIG. 4 is an illustration showing, as an example, a circuit Cr100 for driving a motor MT1. The circuit Cr100 includes the circuit Cr10. The circuit Cr10 includes circuits Cr1a, Cr1b.

The circuit Cr1a is provided at the P-side substrate 3p. That is, the P-side substrate 3p is a member provided with the circuit Cr1a. The circuit Cr1b is provided at the N-side substrate 3n. That is, the N-side substrate 3n is a member provided with the circuit Cr1b. The shape of the P-side substrate 3p as seen in a plan view (the XY plane) is quadrangular. Note that, the shape of the N-side substrate 3n is identical to that of the P-side substrate 3p.

The circuit Cr1a and the circuit Cr1b are electrically connected to each other. The circuit Cr1a does not drive when the circuit Cr1b is driving. Further, the circuit Cr1b does not drive when the circuit Cr1a is driving. That is, the circuit Cr1a and the circuit Cr1b selectively drive.

The circuit Cr1a and the circuit Cr1b are similarly structured. Hereinafter, each of the circuit Cr1a and the circuit Cr1b is also referred to generally as the "circuit Cr1". That is, the circuit Cr10 includes two circuits Cr1.

The circuit Cr1 is structured by a semiconductor element 11 and a diode 12 that functions as a freewheeling diode. The semiconductor element 11 is an IGBT. The semiconductor element 11 and the diode 12 are electrically connected antiparallel to each other. The semiconductor element 11 includes terminals Tm1, Tm2, Tm3. The terminals Tm1, Tm2, Tm3 are a collector terminal, an emitter terminal, and a gate terminal, respectively.

Note that, the structure of the circuit Cr1 is not limited to the above-described structure, and may be other structure. Further, the structure of the circuit Cr10 is not limited to the above-described structure. So long as the circuit Cr1a and the circuit Cr1b can selectively drive, the circuit Cr10 may have a structure different from the above-described structure. Further, the circuits Cr10 respectively included in the k-pieces of semiconductor modules 100 may be structured different from one another.

Hereinafter, the state where the terminal Tm1 and the terminal Tm2 of the semiconductor element 11 are electrically connected to each other is also referred to as the "ON state". Further, hereinafter, the state where the terminal Tm1 and the terminal Tm2 of the semiconductor element 11 are not electrically connected to each other is also referred to as the "OFF state". The state of the semiconductor element 11 includes the ON state and the OFF state.

Further, hereinafter, the voltage for causing the semiconductor element 11 to enter the ON state is also referred to as the "ON voltage". Still further, hereinafter, the voltage for causing the semiconductor element 11 to enter the OFF state is also referred to as the "OFF voltage". The terminal Tm3 being the gate terminal is the terminal for being selectively applied with the ON voltage and the OFF voltage.

Note that, the shape of each of the semiconductor modules 100 as seen in a plan view (the XY plane) is elongated. Specifically, the shape of each of the semiconductor modules 100 as seen in a plan view (the XY plane) is quadrangular. Hereinafter, the longitudinal direction of the semiconductor module 100 as seen in a plan view (the XY plane) is also referred to as the "direction Dr1" or "Dr1". The direction Dr1 includes a direction Dr1a and a direction Dr1b. Each of the direction Dr1a and the direction Dr1b is parallel to the direction Dr1.

The P-side substrate 3p and the N-side substrate 3n of each of the semiconductor module 100 are disposed adjacent to each other along the direction Dr1. Specifically, as shown in FIG. 3A, in the semiconductor module 100a, the P-side substrate 3p and the N-side substrate 3n are provided on the base plate 10 in order of the P-side substrate 3p and the N-side substrate 3n relative to the direction Dr1b.

Further, as shown in FIG. 3B, in the semiconductor module 100b, the N-side substrate 3n and the P-side substrate 3p are provided on the base plate 10 in order of the N-side substrate 3n and the P-side substrate 3p relative to the direction Dr1b.

Hereinafter, the P-side substrate 3p included in the semiconductor module 100a is also referred to as the "P-side substrate 3pa". Further, hereinafter, the N-side substrate 3n included in the semiconductor module 100a is also referred to as the "N-side substrate 3na". Still further, hereinafter, the P-side substrate 3p included in the semiconductor module 100b is also referred to as the "P-side substrate 3pb". Still further, hereinafter, the N-side substrate 3n included in the semiconductor module 100b is also referred to as the "N-side substrate 3nb".

(Characteristic Structure)

Next, a description will be given of the characteristic structure of the present embodiment (hereinafter also referred to as the "structure CtN"). In the present embodiment, as shown in FIG. 1, inside the power conversion device 1000, the semiconductor module 100a and the semiconductor module 100b as the semiconductor module 100 are alternately disposed along the X-axis direction.

FIGS. 5A and 5B are illustrations for describing the disposition structure of the semiconductor module 100a and the semiconductor module 100b according to the first embodiment of the present invention. FIG. 5A is a plan view showing the disposition structure of the semiconductor module 100a and the semiconductor module 100b as the semiconductor module 100. Note that, for the sake of easier understanding of the structure, FIG. 5A does not show the housing 20.

Hereinafter, the four semiconductor modules 100 included in the power conversion device 1000 are also referred to as the semiconductor modules 100-1, 100-2, 100-3, 100-4, respectively.

Further, hereinafter, the direction perpendicular to the direction Dr1 as seen in a plan view (the XY plane) is also referred to as the "direction Dr2" or "Dr2". The direction Dr2 is the direction along the XY plane. For example, when the direction Dr1 is the Y-axis direction, the direction Dr2 is the X-axis direction.

In the structure CtN, the semiconductor modules 100-1, 100-2, 100-3, 100-4 are disposed adjacent to one another along the direction Dr2 in order of the semiconductor modules 100-1, 100-2, 100-3, 100-4.

FIG. 5B is a cross-sectional view showing the disposition structure of the semiconductor module 100a and the semiconductor module 100b as the semiconductor module 100. FIG. 5B is a cross-sectional view of the lower part side of the power conversion device 1000 shown in FIG. 5A as an example. Note that, for the sake of easier understanding of the structure, FIG. 5B does not show the base plate 10 provided with the P-side substrate 3p and the N-side substrate 3n.

With reference to FIG. 5A, the semiconductor module 100a and the semiconductor module 100b are alternately disposed along the direction Dr2 (the X-axis direction). That is, the four semiconductor modules 100 included in the power conversion device 1000 include the semiconductor module 100a and the semiconductor module 100b disposed adjacent to each other. Further, in the structure CtN, the semiconductor module 100a and the semiconductor module 100b adjacent to each other are disposed at a predetermined interval along the direction Dr2 (the X-axis direction).

Further, in the structure CtN, the semiconductor modules 100-1, 100-2, 100-3, 100-4 are parallel to one another in terms of their longitudinal direction (Dr1). Specifically, the longitudinal direction (Dr1) of the semiconductor module 100a is parallel to the longitudinal direction (Dr1) of the semiconductor module 100b.

Further, the P-side substrate 3p of the semiconductor module 100a and the N-side substrate 3n of the semiconductor module 100b are disposed linearly along the direction Dr2. Still further, the N-side substrate 3n of the semiconductor module 100a and the P-side substrate 3p of the semiconductor module 100b are linearly disposed along the direction Dr2.

Accordingly, the P-side substrate 3p of the semiconductor module 100a and the N-side substrate 3n of the semiconductor module 100b are alternately disposed along the direction Dr2.

Hereinafter, the line segment that crosses the direction Dr1 as seen in a plan view (the XY plane) is also referred to as the "crossing line segment Lx" or "Lx". Further, hereinafter, the crossing line segment Lx being parallel to the direction Dr2 is also referred to as the "crossing line segment Lx2" or "Lx2". That is, the P-side substrate 3p of the semiconductor module 100a and the N-side substrate 3n of the semiconductor module 100b are disposed adjacent to each other along the crossing line segment Lx2. Further, the N-side substrate 3n of the semiconductor module 100a and the P-side substrate 3p of the semiconductor module 100b are disposed adjacent to each other along the crossing line segment Lx2.

Hereinafter, the structure for allowing the k-pieces of semiconductor modules 100 to drive in parallel is also referred to as the "parallel drive structure". The power conversion device 1000 has the parallel drive structure. Specifically, respective circuits Cr10 of the four semiconductor modules 100 are electrically connected in parallel to one another. Thus, the power conversion device 1000 can drive the four semiconductor modules 100 in parallel.

(Operation of Power Conversion Device)

Next, a description will be given of the process performed by the power conversion device 1000 according to the present embodiment (hereinafter also referred to as the "drive process Pr"). In the drive process Pr, a P-side drive process and an N-side drive process are alternately performed.

Here, a description will be given of the P-side drive process. In the P-side drive process, in each of the k-pieces of semiconductor modules 100 including the semiconductor modules 100a, 100b, the circuit Cr1a of the P-side substrate 3p drives. In this case, in the semiconductor module 100a, the P-side substrate 3p generates heat, and the semiconductor module 100b adjacent to the semiconductor module 100a enters the state where the P-side substrate 3p generates heat (hereinafter also referred to as the "P-side heat generating state"). In the P-side heat generating state, the heat of the P-side substrate 3p is transferred to the heat dissipation plate 50 via the base plate 10.

Hereinafter, the state where the drive process Pr is performed is also referred to as the "drive process executing state". Further, hereinafter, in the drive process executing state, the P-side substrate 3p or the N-side substrate 3n provided with the circuit Cr1 in the driving mode is also referred to as the "drive substrate". Still further, hereinafter, in the drive process executing state, the P-side substrate 3p or the N-side substrate 3n provided with the circuit Cr1 not in the driving mode is also referred to as the "non-drive substrate".

Note that, as shown in FIG. 5A, the P-side substrate 3p (3pa) of the semiconductor module 100a and the N-side substrate 3n (3nb) of the semiconductor module 100b are alternately disposed along the direction Dr2. Accordingly, the position of the P-side substrate 3p of the semiconductor module 100a is spaced apart from the position of the P-side substrate 3p of the semiconductor module 100b adjacent to the semiconductor module 100a.

Accordingly, when the P-side heat generating state is entered, a plurality of P-side substrates 3p (the drive substrates) generating heat will not be concentrated on the same side. As a result, interference of heat generated by each of the P-side substrates 3p (the drive substrates) can be suppressed. Thus, the power conversion device with excellent heat dissipation property can be obtained.

Note that, the N-side drive process is a driving process of the circuit Cr1b of the N-side substrate 3n of each of the k-pieces of semiconductor modules 100. Accordingly, when the N-side drive process is performed also, the effect similar to that exhibited when the P-side drive process is performed is exhibited.

As has been described above, according to the present embodiment, the P-side substrate 3p of the semiconductor module 100a and the N-side substrate 3n of the semiconductor module 100b are disposed adjacent to each other along the crossing line segment Lx2 that crosses the direction Dr1 as seen in a plan view. Thus, an increase in size of the region required for disposing the semiconductor module 100a and the semiconductor module 100b can be suppressed.

Further, the P-side substrate 3p is provided with the circuit Cr1a. The N-side substrate 3n is provided with the circuit Cr1b. The circuit Cr1a does not drive when the circuit Cr1b is driving. The circuit Cr1b does not drive when the circuit Cr1a is driving.

Therefore, when the circuit Cr1b is driving, to the circuit Cr1b (the N-side substrate 3n) generating heat, the circuit Cr1a (the P-side substrate 3p) not in the driving mode is adjacent. Thus, it becomes possible to improve the heat dissipation property of the power conversion device.

From the foregoing, it becomes possible to provide the power conversion device with excellent heat dissipation property while an increase in size of the region required for disposing a plurality of semiconductor modules 100 is suppressed.

Further, in the present embodiment, by the P-side substrate 3p and the N-side substrate 3n being disposed as described above, in the drive process executing state, for example, interference of heat generated by each of the drive substrates can be suppressed. Thus, the power conversion device with excellent heat dissipation property can be obtained. Further, the time required for dissipating heat in the power conversion device can be shortened. Still further, downsizing of the heat dissipation plate 50 can be realized. Further, the restriction on the mounting position of the power conversion device can be relaxed.

Note that, it has been described that the power conversion device 1000 according to the present embodiment has the structure in which the P-side substrate 3p and the N-side substrate 3n are alternately disposed along the direction Dr2 (the crossing line segment Lx) (hereinafter also referred to as the "structure Ctx"). However, the power conversion device 1000 may have, instead of the structure Ctx, the following structure Ctxa.

The structure Ctxa is the structure in which not all of the plurality of substrates disposed along the crossing line segment Lx are of an identical type of the substrates.

Here, for example, it is assumed that the four substrates are linearly disposed along the crossing line segment Lx. Further, it is assumed that the four substrates are structured by three N-side substrates 3n and one N-side substrate 3n. In this case, in the structure Ctxa, two or three N-side substrates 3n are adjacent to each other along the crossing line segment Lx.

Further, for example, it is assumed that two N-side substrates 3nb are disposed adjacent to each other. In this case, in the structure Ctxa, for example, two P-side substrates 3pa are disposed along the crossing line segment Lx so that two N-side substrates 3nb are interposed between the two P-side substrates 3pa.

Note that, in the conventional power conversion device that does not have the structure in which a plurality of elements (semiconductor modules) are used in parallel, when an element of a rated current of 1500 (A) is used, a great mounting area is required for each element. The size of the mounting area is, for example, 140 mm×190 mm.

Therefore, conventionally, for example, there exists the state where, despite the demand for the structure with a rated current of 1350 (A), an element supporting a rated current greater than necessary must be inevitably used. Hence, there exists the problem of the need for the above-described great mounting area with which excellent heat dissipation property can be secured.

In view of the foregoing, the power conversion device 1000 according to the present embodiment is structured as described above and, therefore, is capable of improving the heat dissipation property while realizing optimum customizability in the structure using elements supporting various drive conditions. Thus, downsizing of the heat dissipation plate 50 can be realized. Further, the restriction on the mounting position of the power conversion device can be relaxed. From the foregoing, the power conversion device 1000 according to the present embodiment can solve the above-described problems.

Second Embodiment

The structure of the present embodiment is the structure characterized in the interval of a plurality of semiconductor modules (hereinafter also referred to as the "structure CtA"). Hereinafter, the power conversion device having the structure CtA is also referred to as the "power conversion device 1000A". Similarly to the first embodiment, the power conversion device 1000A performs the above-described drive process Pr.

Figure 6A:
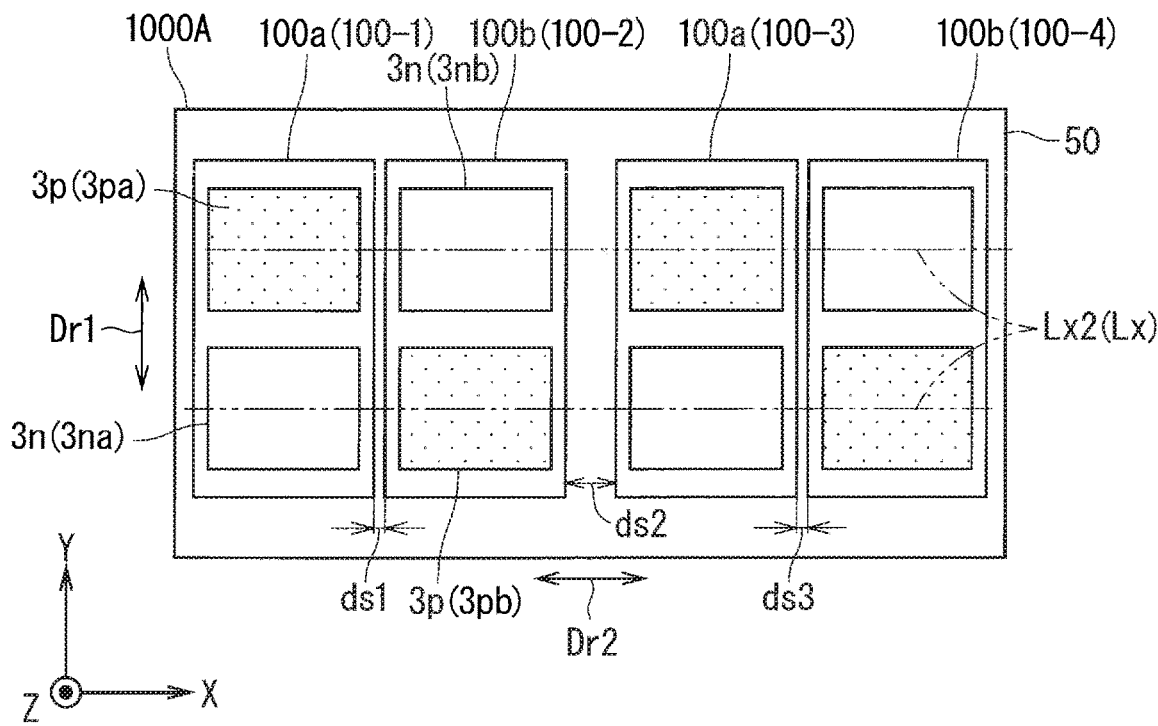
FIGS. 6A and 6B are illustrations for describing the structure of a power conversion device according to a second embodiment of the present invention.
Figure 6B:
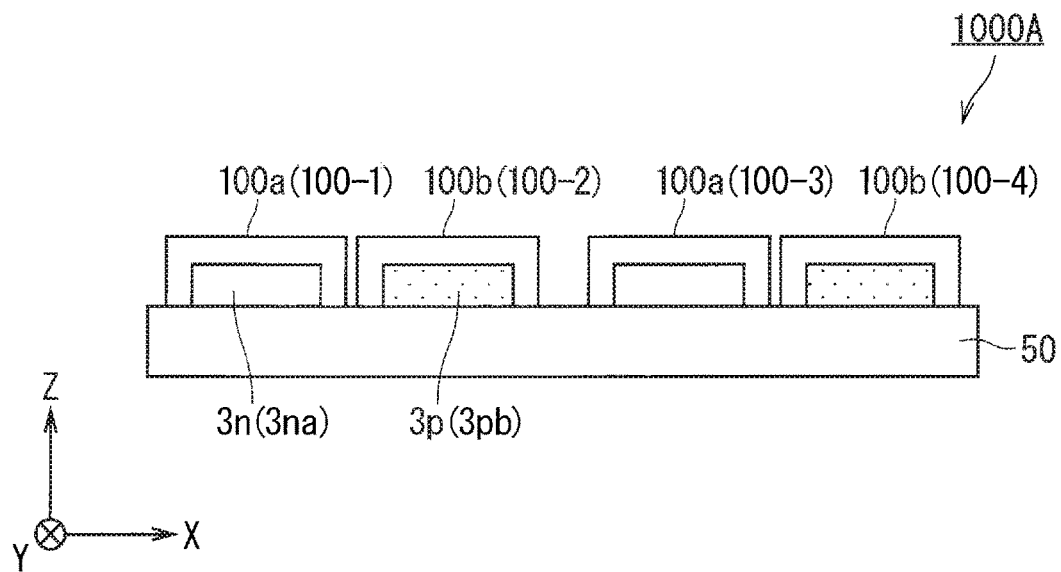

FIGS. 6A and 6B are illustrations for describing the structure of the power conversion device 1000A according to a second embodiment of the present invention. FIG. 6A is a plan view showing the disposition structure of the semiconductor module 100a and the semiconductor module 100b according to the second embodiment of the present invention. FIG. 6B is a cross-sectional view showing the disposition structure of the semiconductor module 100a and the semiconductor module 100b according to the second embodiment of the present invention.

The power conversion device 1000A includes k-pieces of semiconductor modules 100. In the present embodiment, as an example, "k" is 4. Note that, "k" is not limited to 4, and may be 5 or greater.

With reference to FIGS. 6A and 6B, the power conversion device 1000A is different from the power conversion device 1000 shown in FIGS. 5A and 5B in the disposition state of the k-pieces of semiconductor modules 100. The rest of the structure of the power conversion device 1000A is similar to that of the power conversion device 1000 and, therefore, the detailed description thereof will not be repeated.

Next, a detailed description will be given of the structure CtA. With reference to FIG. 6A, in the structure CtA, the semiconductor modules 100-1, 100-2, 100-3, 100-4 are disposed adjacent to one another along the direction Dr2 in order of the semiconductor modules 100-1, 100-2, 100-3, 100-4.

Further, in the structure CtA, the semiconductor modules 100-1, 100-2, 100-3, 100-4 are parallel to one another in terms of their longitudinal direction (Dr1). That is, the longitudinal direction (Dr1) of each of the semiconductor module 100-3 and the semiconductor module 100-4 is parallel to the longitudinal direction (Dr1) of the semiconductor module 100-2.

Further, the N-side substrate 3n of the semiconductor module 100-2 and the P-side substrate 3p of the semiconductor module 100-3 are disposed linearly along the direction Dr2. Still further, the P-side substrate 3p of the semiconductor module 100-2 and the N-side substrate 3n of the semiconductor module 100-3 are linearly disposed along the direction Dr2.

Further, in the structure CtA, the P-side substrate 3p of the semiconductor module 100a and the N-side substrate 3n of the semiconductor module 100b are disposed adjacent to each other along the crossing line segment Lx2. Further, the N-side substrate 3n of the semiconductor module 100a and the P-side substrate 3p of the semiconductor module 100b are disposed adjacent to each other along the crossing line segment Lx2.

The structure CtA is set so that the interval between two semiconductor modules 100 at the central part of the k-pieces of semiconductor modules 100 becomes greater. The structure CtA is set so that, for example, the interval existing between the semiconductor module 100-2 and the semiconductor module 100-3, which exist between the semiconductor module 100-1 and the semiconductor module 100-4, becomes greater.

Hereinafter, the interval between the semiconductor module 100-2 and the semiconductor module 100-3 in the direction Dr2 is also referred to as the "interval ds2" or "ds2". Further, hereinafter, the interval between the semiconductor module 100-1 and the semiconductor module 100-2 in the direction Dr2 is also referred to as the "interval ds1" or "ds1". Still further, hereinafter, the interval between the semiconductor module 100-3 and the semiconductor module 100-4 in the direction Dr2 is also referred to as the "interval ds3" or "ds3". The interval ds3 is identical to the interval ds1.

In the structure CtA, the interval ds2 is greater than the interval ds1 and the interval ds3. Note that, the interval ds3 may be different from the interval ds1 provided that the interval ds3 satisfies the requirement of its being greater than the interval ds1.

As has been described above, in the present embodiment, the interval ds2 is greater than the interval ds1 and the interval ds3. That is, the structure CtA is set so that the interval between the semiconductor module 100-2 and the semiconductor module 100-3 existing at the central part of the k-pieces of semiconductor modules 100 becomes greater.

Thus, in the drive process executing state, it becomes possible to suppress heat generated by each of the drive substrates (for example, the P-side substrates 3p) of the semiconductor modules 100-2, 100-3 from interfering with each other. Thus, the power conversion device with excellent heat dissipation property securing the space for heat dissipation can be obtained.

Further, the power conversion device 1000A having the structure CtA exhibits the effect similar to that exhibited by the first embodiment. Still further, similarly to the power conversion device 1000, the power conversion device 1000A may have the above-described structure Ctxa.

Third Embodiment

The structure of the present embodiment is the structure characterized in the position of a plurality of semiconductor modules (hereinafter also referred to as the "structure CtB"). Hereinafter, the power conversion device having the structure CtB is also referred to as the "power conversion device 1000B". Similarly to the first embodiment, the power conversion device 1000B performs the above-described drive process Pr.

Figure 7A:
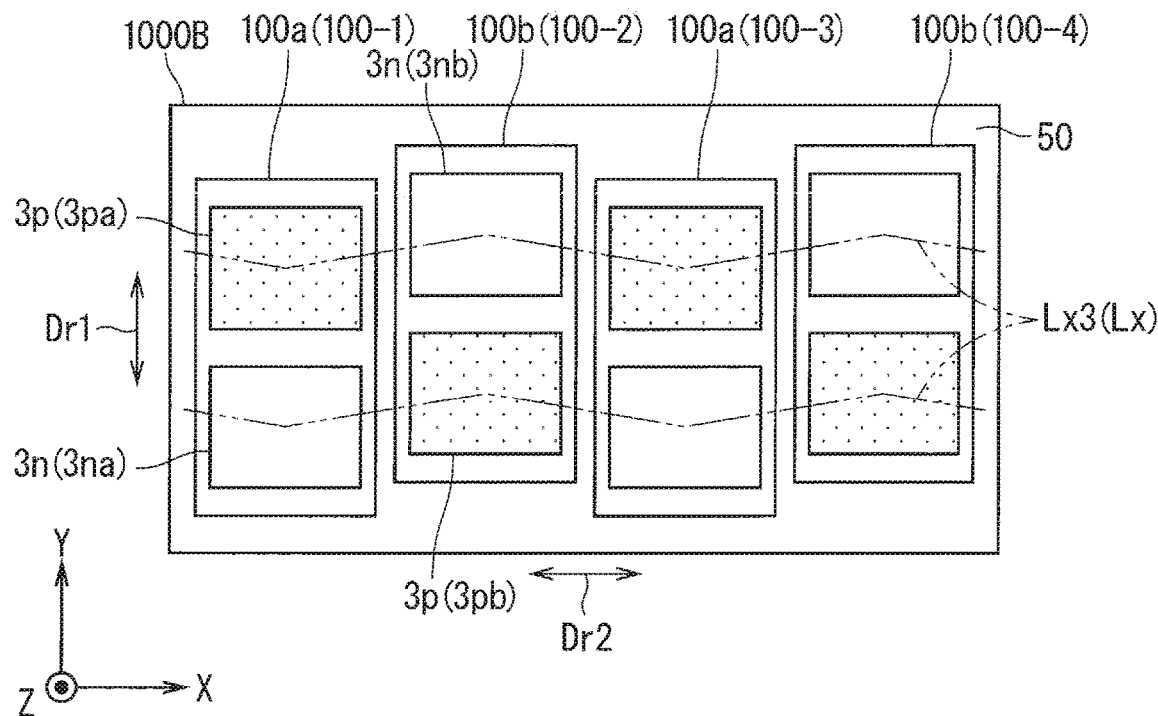
FIGS. 7A and 7B are illustrations for describing the structure of a power conversion device according to a third embodiment of the present invention.
Figure 7B:
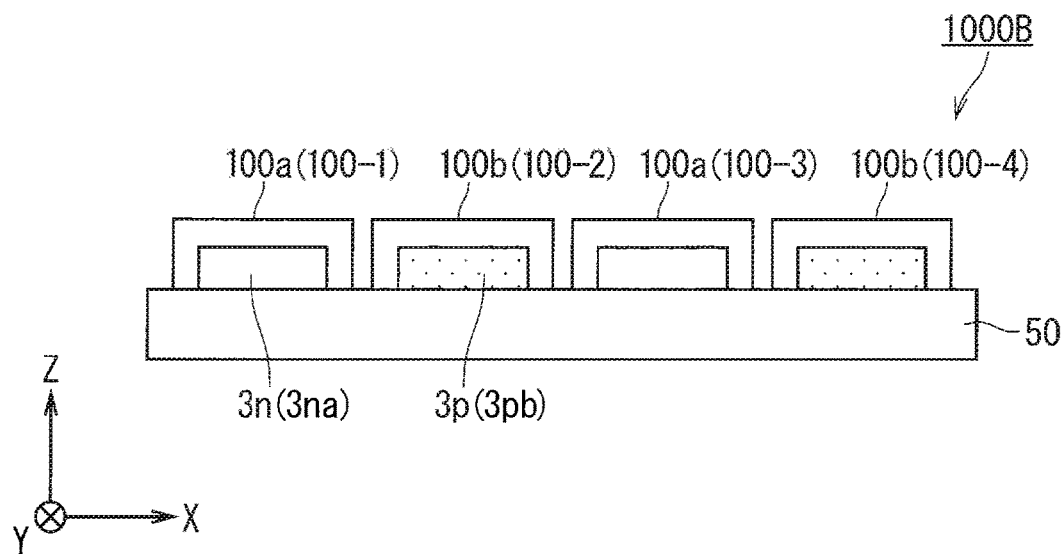

FIGS. 7A and 7B are illustrations for describing the structure of the power conversion device 1000B according to a third embodiment of the present invention. FIG. 7A is a plan view showing the disposition structure of the semiconductor module 100a and the semiconductor module 100b according to the third embodiment of the present invention. FIG. 7B is a cross-sectional view showing the disposition structure of the semiconductor module 100a and the semiconductor module 100b according to the third embodiment of the present invention.

The power conversion device 1000B includes k-pieces of semiconductor modules 100. In the present embodiment, as an example, "k" is 4. Note that, "k" is not limited to 4, and may be 2, 3, or 5 or more.

With reference to FIGS. 7A and 7B, the power conversion device 1000B is different from the power conversion device 1000 shown in FIGS. 5A and 5B in the disposition state of the k-pieces of semiconductor modules 100. The rest of the structure of the power conversion device 1000B is similar to that of the power conversion device 1000 and, therefore, the detailed description thereof will not be repeated.

Next, a detailed description will be given of the structure CtB. With reference to FIG. 7A, in the structure CtB, the semiconductor modules 100-1, 100-2, 100-3, 100-4 are disposed adjacent to one another along the direction Dr2 in order of the semiconductor modules 100-1, 100-2, 100-3, 100-4.

Further, in the structure CtB, the semiconductor modules 100-1, 100-2, 100-3, 100-4 are parallel to one another in terms of their longitudinal direction (Dr1). That is, the longitudinal direction (Dr1) of the semiconductor module 100a is parallel to the longitudinal direction (Dr1) of the semiconductor module 100b.

Further, in the structure CtB, the semiconductor module 100a and the semiconductor module 100b being adjacent to each other are disposed at a predetermined interval along the direction Dr2 (the X-axis direction).

Further, in the structure CtB, the semiconductor modules 100-1, 100-2, 100-3, 100-4 are disposed zigzag along the direction Dr2.

Hereinafter, the crossing line segment Lx in the structure CtB is also referred to as the "crossing line segment Lx3" or "Lx3". The shape of the crossing line segment Lx3 in the structure CtB is zigzag.

In the structure CtB, the P-side substrate 3p of the semiconductor module 100a and the N-side substrate 3n of the semiconductor module 100b are disposed adjacent to each other along the crossing line segment Lx3. Further, the N-side substrate 3n of the semiconductor module 100a and the P-side substrate 3p of the semiconductor module 100b are disposed adjacent to each other along the crossing line segment Lx3.

As has been described above, in the present embodiment, the semiconductor modules 100-1, 100-2, 100-3, 100-4 are disposed zigzag along the direction Dr2. Further, the P-side substrate 3p of the semiconductor module 100a and the N-side substrate 3n of the semiconductor module 100b are disposed adjacent to each other along the zigzag crossing line segment Lx3.

Thus, in the k-pieces of semiconductor modules 100 in the drive process executing state, the thermal interference in the direction Dr2 can be suppressed. Hence, the power conversion device with excellent heat dissipation property securing the space for heat dissipation can be obtained.

Further, the power conversion device 1000B having the structure CtB exhibits the effect similar to that exhibited by the first embodiment. Still further, similarly to the power conversion device 1000, the power conversion device 1000B may have the above-described structure Ctxa.

Fourth Embodiment

The structure of the present embodiment is the structure obtained by combining the above-described structure CtA and the above-described structure CtB (hereinafter referred to as the "structure CtAb"). Hereinafter, the power conversion device having the structure CtAb is also referred to as the "power conversion device 1000Ab". Similarly to the first embodiment, the power conversion device 1000Ab performs the above-described drive process Pr.

Figure 8A:
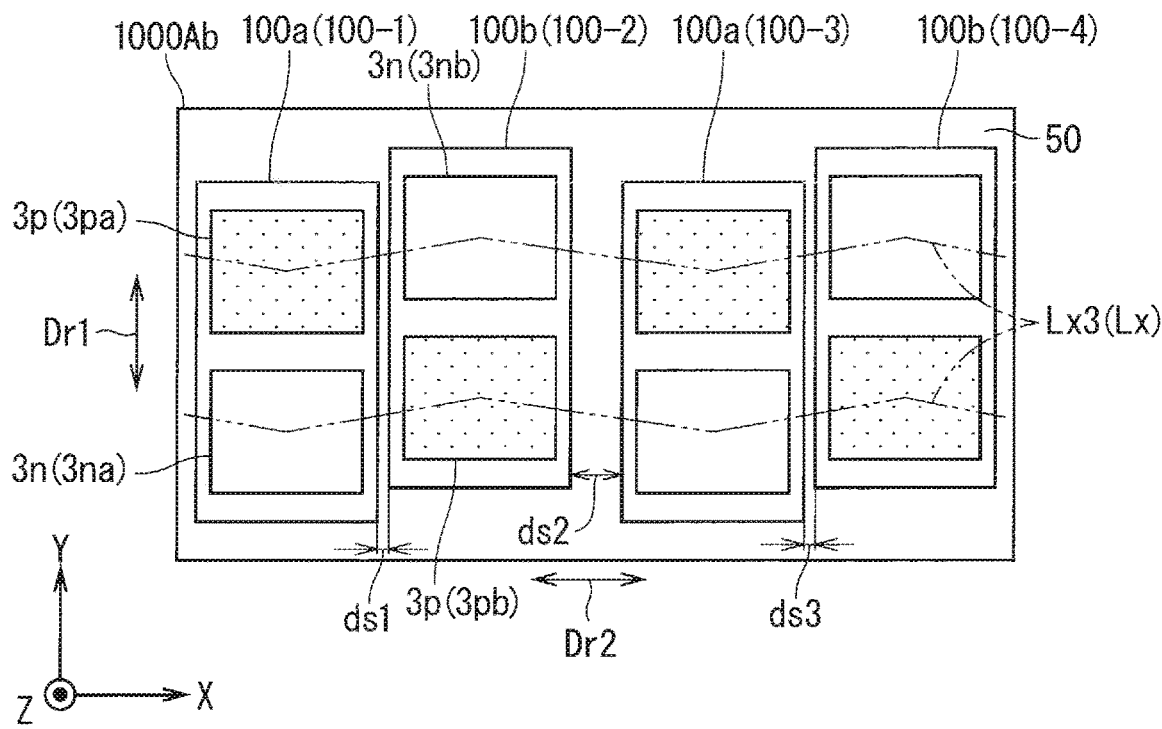
FIGS. 8A and 8B are illustrations for describing the structure of a power conversion device according to a fourth embodiment of the present invention.
Figure 8B:
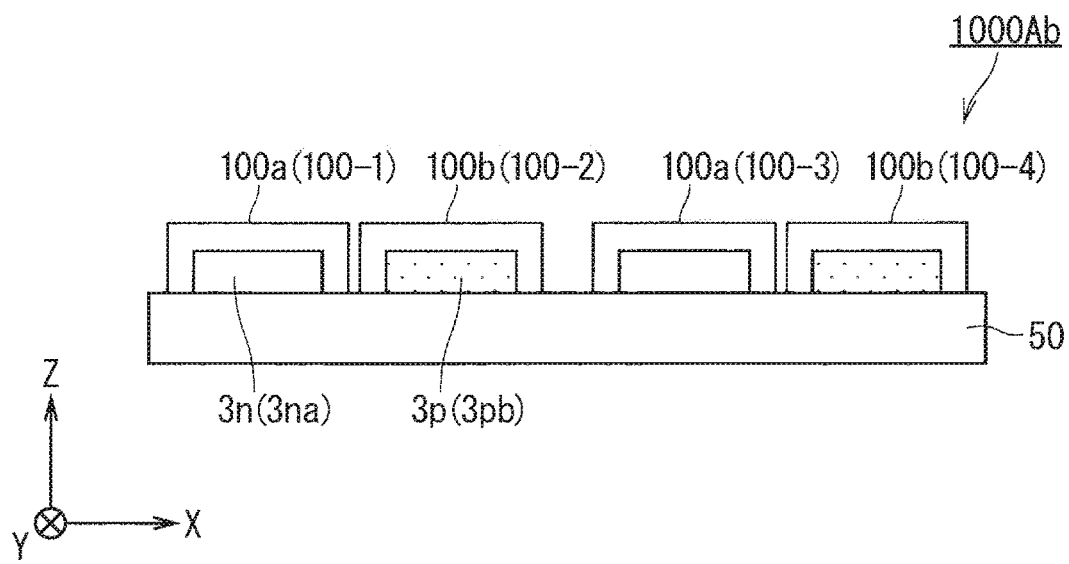

FIGS. 8A and 8B are illustrations for describing the structure of the power conversion device 1000Ab according to a fourth embodiment of the present invention. FIG. 8A is a plan view showing the disposition structure of the semiconductor module 100a and the semiconductor module 100b according to the fourth embodiment of the present invention. FIG. 8B is a cross-sectional view showing the disposition structure of the semiconductor module 100a and the semiconductor module 100b according to the fourth embodiment of the present invention.

The power conversion device 1000B includes k-pieces of semiconductor modules 100. In the present embodiment, as an example, "k" is 4. Note that, "k" is not limited to 4, and may be 3, or 5 or greater.

With reference to FIGS. 8A and 8B, the power conversion device 1000Ab is different from the power conversion device 1000 shown in FIGS. 5A and 5B in the disposition state of the k-pieces of semiconductor modules 100. The rest of the structure of the power conversion device 1000Ab is similar to that of the power conversion device 1000 and, therefore, the detailed description thereof will not be repeated. The power conversion device 1000Ab has the structure CtA and the structure CtB.

Next, a detailed description will be given of the structure CtAb. With reference to FIG. 8A, in the structure CtAb, the semiconductor modules 100-1, 100-2, 100-3, 100-4 are disposed adjacent to one another along the direction Dr2 in order of the semiconductor modules 100-1, 100-2, 100-3, 100-4.

Further, in the structure CtAb, the semiconductor modules 100-1, 100-2, 100-3, 100-4 are parallel to one another in terms of their longitudinal direction (Dr1). That is, the longitudinal direction (Dr1) of each of the semiconductor module 100-3 and the semiconductor module 100-4 is parallel to the longitudinal direction (Dr1) of the semiconductor module 100-2.

Further, in the structure CtAb, the semiconductor modules 100-1, 100-2, 100-3, 100-4 are disposed zigzag along the direction Dr2. In the structure CtAb, the shape of the crossing line segment Lx3 is zigzag.

In the structure CtAb, the P-side substrate 3p of the semiconductor module 100a and the N-side substrate 3n of the semiconductor module 100b are disposed adjacent to each other along the crossing line segment Lx3. Specifically, the P-side substrate 3p of the semiconductor module 100-1, the N-side substrate 3n of the semiconductor module 100-2, the P-side substrate 3p of the semiconductor module 100-3, and the N-side substrate 3n of the semiconductor module 100-4 are disposed adjacent to one another along the crossing line segment Lx3.

Further, the N-side substrate 3n of the semiconductor module 100a and the P-side substrate 3p of the semiconductor module 100b are disposed adjacent to each other along the crossing line segment Lx3. Specifically, the N-side substrate 3n of the semiconductor module 100-1, the P-side substrate 3p of the semiconductor module 100-2, the N-side substrate 3n of the semiconductor module 100-3, and the P-side substrate 3p of the semiconductor module 100-4 are disposed adjacent to one another along the crossing line segment Lx3.

In the structure CtAb, the interval ds2 is greater than the interval ds1 and the interval ds3. As has been described above, the interval ds2 is the interval between the semiconductor module 100-2 and the semiconductor module 100-3 in the direction Dr2. As has been described above, the interval ds1 is the interval between the semiconductor module 100-1 and the semiconductor module 100-2 in the direction Dr2. As has been described above, the interval ds3 is the interval between the semiconductor module 100-3 and the semiconductor module 100-4 in the direction Dr2.

As has been described above, the structure CtAb of the present embodiment is the combination of the structure CtA and the structure CtB. Accordingly, the effect similar to that exhibited by the second and third embodiments is exhibited. That is, in the drive process executing state, interference of heat generated by the drive substrate of each of the semiconductor modules 100-2, 100-3 existing at the central part of the k-pieces of semiconductor modules 100 can be suppressed.

Further, in the k-pieces of semiconductor modules 100 in the drive process executing state, the thermal interference in the direction Dr2 can be suppressed. Thus, the power conversion device with excellent heat dissipation property securing the space for heat dissipation can be obtained.

Further, similarly to the power conversion device 1000, the power conversion device 1000Ab may have the above-described structure Ctxa.

Fifth Embodiment

The structure of the present embodiment is the structure characterized in the disposition of a plurality of semiconductor modules based on the position of the power supply (hereinafter also referred to as the "structure CtC"). In the following, the power conversion device having the structure CtC is also referred to as the "power conversion device 1000C". Similarly to the first embodiment, the power conversion device 1000C performs the above-described drive process Pr.

Figure 9A:
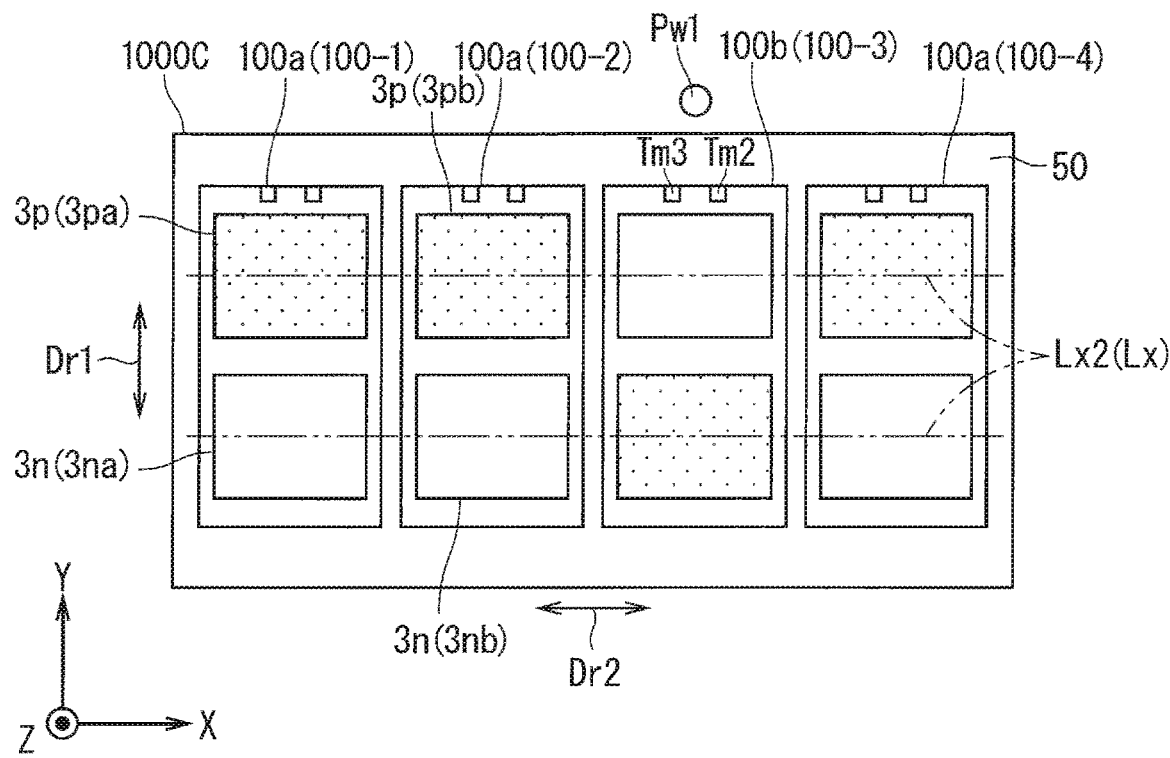
FIGS. 9A and 9B are illustrations for describing the structure of a power conversion device according to a fifth embodiment of the present invention.
Figure 9B:
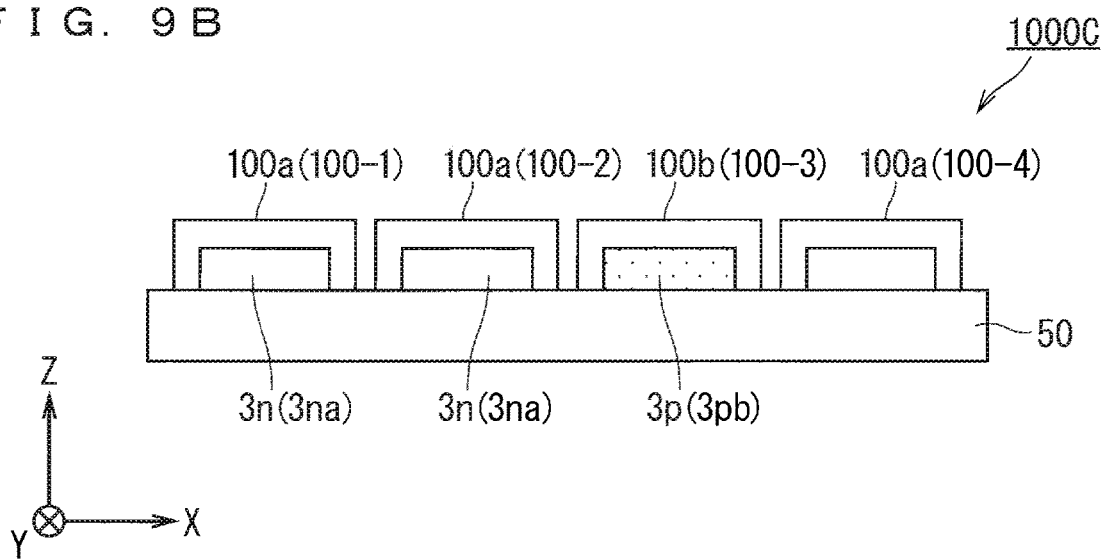

FIGS. 9A and 9B are illustrations for describing the structure of the power conversion device 1000C according to a fifth embodiment of the present invention. FIG. 9A is a plan view of the disposition structure of the semiconductor module 100a and the semiconductor module 100b according to the fifth embodiment of the present invention. Note that, FIG. 9A shows the above-described power supply Pw1 included in the power conversion device 1000C. Further, FIG. 9A shows the above-described terminals Tm2, Tm3 according to the semiconductor module 100.

FIG. 9B is a cross-sectional view showing the disposition structure of the semiconductor module 100a and the semiconductor module 100b according to the fifth embodiment of the present invention.

The power conversion device 1000C includes k-pieces of semiconductor modules 100. In the present embodiment, as an example, "k" is 4. Note that, "k" is not limited to 4, and may be 3, or 5 or greater.

With reference to FIGS. 9A and 9B, the power conversion device 1000C is different from the power conversion device 1000 shown in FIGS. 5A and 5B in the disposition state of the k-pieces of semiconductor modules 100. The rest of the structure of the power conversion device 1000B is similar to that of the power conversion device 1000 and, therefore, the detailed description thereof will not be repeated.

Hereinafter, the end in the longitudinal direction (Dr1) of the semiconductor module 100 as seen in a plan view (the XY plane) is also referred to as the "end Eg". The terminal Tm3 (the gate terminal) of each of the semiconductor modules 100 is provided at the end Eg of the semiconductor module 100.

Hereinafter, out of the k-pieces of semiconductor modules 100 included in the power conversion device 1000C, the semiconductor module 100 whose terminal Tm3 is closest to the power supply Pw1 is also referred to as the "power supply proximity module". The k-pieces of semiconductor modules 100 include the power supply proximity module.

Further, hereinafter, the semiconductor module 100 not corresponding to the power supply proximity module is also referred to as the "power supply non-proximity module". The k-pieces of semiconductor modules include (k−1)-pieces of power supply non-proximity modules.

Here, the following precondition Pr1 is considered. In the precondition Pr1, the power supply proximity module is, as an example, the semiconductor module 100-3. Therefore, the (k−1)-pieces of power supply non-proximity modules are the semiconductor modules 100-1, 100-2, 100-4.

Further, in the precondition Pr1, the semiconductor module 100-3 is the semiconductor module 100b. Still further, in the precondition Pr1, each of the (k−1)-pieces of power supply non-proximity modules is the semiconductor module 100a.

Note that, in the case where the power conversion device 1000C performs the above-described drive process Pr, greater heat is generated in close proximity to the terminal Tm3. Further, the power supply proximity module generates heat greatest. Therefore, the structure CtC is the structure of enhancing the heat dissipation property of the power supply proximity module that generates heat greatest. In the structure CtC, the disposition of the P-side substrate 3p and the N-side substrate 3n of just the power supply proximity module is different from the disposition of the P-side substrate 3p and the N-side substrate 3n of the power supply non-proximity module.

Next, a detailed description will be given of the structure CtC. FIG. 8A is an illustration for describing the structure CtC to which the precondition Pr1 is applied. With reference to FIG. 8A, in the structure CtC, the semiconductor modules 100-1, 100-2, 100-3, 100-4 are disposed adjacent to one another along the direction Dr2 in order of the semiconductor modules 100-1, 100-2, 100-3, 100-4.

Note that, in the structure CtC to which the precondition Pr1 is applied, the power supply proximity module and the (k−1)-pieces of power supply non-proximity modules are disposed adjacent to one another along the direction Dr2.

Further, in the structure CtC, the semiconductor modules 100-1, 100-2, 100-3, 100-4 are parallel to one another in terms of their longitudinal direction (Dr1). That is, the longitudinal direction (Dr1) of each of the power supply non-proximity module is parallel to the longitudinal direction (Dr1) of the power supply proximity module.

Further, the P-side substrate 3p of each of the power supply non-proximity modules and the N-side substrate 3n of the power supply proximity module are disposed linearly along the direction Dr2. Still further, the N-side substrate 3n of each of the power supply non-proximity modules and the P-side substrate 3p of the power supply proximity module are disposed linearly along the direction Dr2.

Further, in the structure CtC, the P-side substrate 3p of the power supply non-proximity module (the semiconductor module 100a) and the N-side substrate 3n of the power supply proximity module (the semiconductor module 100b) are disposed adjacent to each other along the crossing line segment Lx2. Further, the N-side substrate 3n of the power supply non-proximity module (the semiconductor module 100a) and the P-side substrate 3p of the power supply proximity module (the semiconductor module 100b) are disposed adjacent to each other along the crossing line segment Lx2.

As has been described above, in the structure CtC of the present embodiment, the disposition of the P-side substrate 3p and the N-side substrate 3n of just the power supply proximity module is different from the disposition of the P-side substrate 3p and the N-side substrate 3n of the power supply non-proximity module. Thus, the heat dissipation property of the power supply proximity module that generates heat greatest in the drive process executing state can be enhanced.

Further, it becomes possible to suppress heat generated by the drive substrate (for example, the P-side substrate 3p) of the power supply proximity module in the drive process executing state from interfering with the non-drive substrate (for example, the N-side substrate 3n) of the power supply non-proximity module. Thus, the power conversion device with excellent heat dissipation property securing the space for heat dissipation can be obtained.

Sixth Embodiment

The structure of the present embodiment is the structure characterized in the disposition of a plurality of semiconductor modules in which the heat spreading direction is taken into consideration (hereinafter also referred to as the "structure CtD"). Hereinafter, the power conversion device having the structure CtD is also referred to as the "power conversion device 1000D". Similarly to the first embodiment, the power conversion device 1000D performs the above-described drive process Pr.

Figure 10:
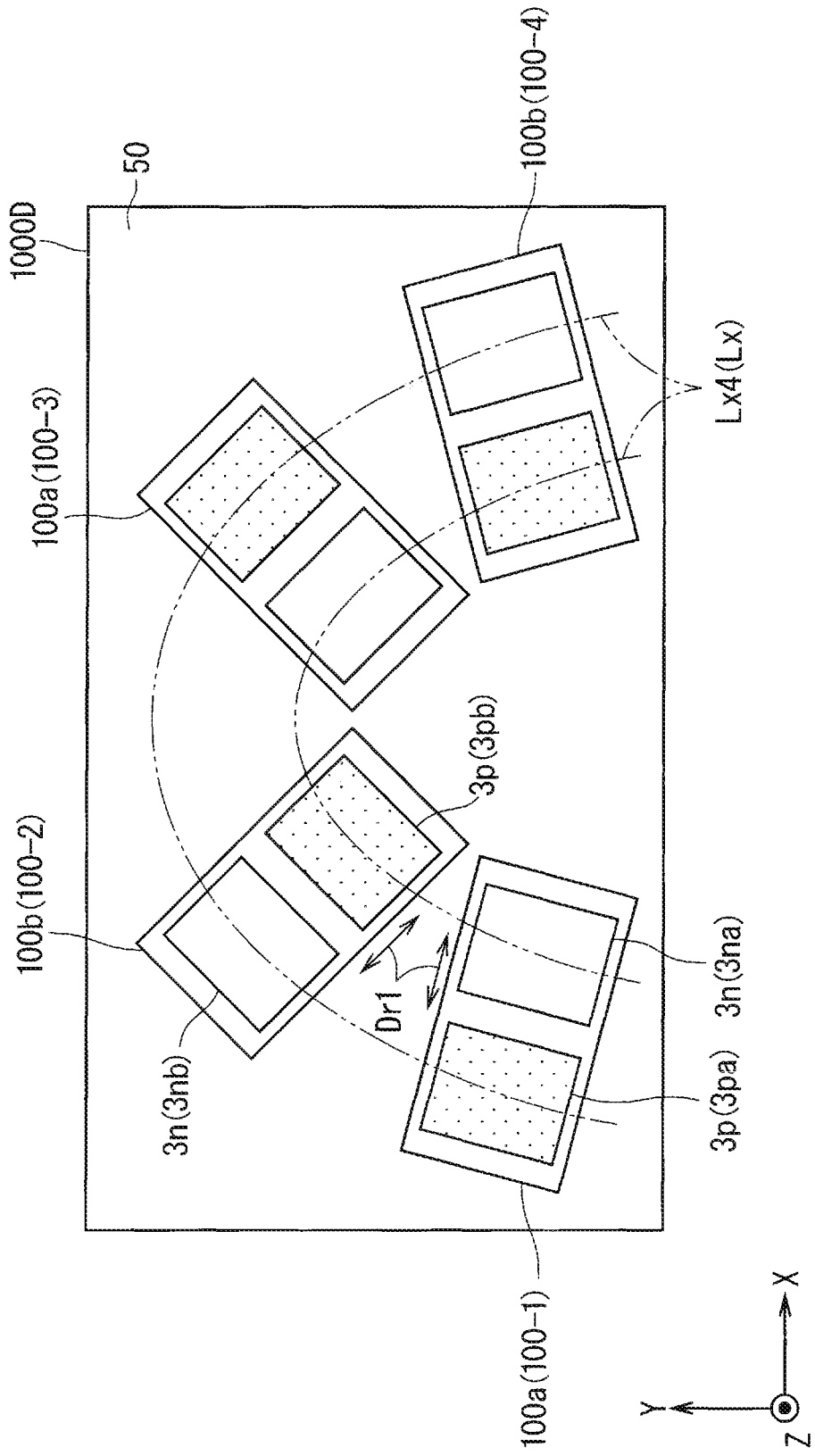
FIG. 10 is a plan view showing the structure of a power conversion device according to a sixth embodiment of the present invention.

FIG. 10 is a plan view showing the structure of the power conversion device 1000D according to a sixth embodiment of the present invention. The power conversion device 1000D includes k-pieces of semiconductor modules 100. In the present embodiment, as an example, "k" is 4. Note that, "k" is not limited to 4, and may be 2, 3, or 5 or greater.

With reference to FIG. 10, the power conversion device 1000D is different from the power conversion device 1000 shown in FIGS. 5A and 5B in the disposition state of the k-pieces of semiconductor modules 100. The rest of the structure of the power conversion device 1000D is similar to that of the power conversion device 1000 and, therefore, the detailed description thereof will not be repeated.

Next, a detailed description will be given of the structure CtD. With reference to FIG. 10, in the structure CtD, the k-pieces of semiconductor modules 100 are disposed radially (elliptic arc-like). In the structure CtD, the longitudinal direction (Dr1) of the semiconductor module 100a crosses the longitudinal direction (Dr1) of the semiconductor module 100b.

Hereinafter, the crossing line segment Lx in the structure CtD is also referred to as the "crossing line segment Lx4" or "Lx4". The shape of the crossing line segment Lx4 in the structure CtD is elliptic arc-like.

In the structure CtD, the P-side substrate 3p of the semiconductor module 100a and the N-side substrate 3n of the semiconductor module 100b are disposed adjacent to each other along the elliptic arc-like crossing line segment Lx4. Further, the N-side substrate 3n of the semiconductor module 100a and the P-side substrate 3p of the semiconductor module 100b are disposed adjacent to each other along the elliptic arc-like crossing line segment Lx4.

Note that, in the case where heat generated by the drive substrate is transferred to the heat dissipation plate 50 in the drive process executing state, heat radially spreads in the heat dissipation plate 50. Note that, in the structure CtD according to the present embodiment, the k-pieces of semiconductor modules 100 are disposed radially (elliptic arc-like). Accordingly, the space for dissipating heat generated by each of the semiconductor modules 100 in the drive process executing state can be provided.

Thus, it becomes possible to suppress interference of heat generated by the drive substrate (for example, the P-side substrate 3p) of each of the semiconductor modules 100 in the drive process executing state among the semiconductor modules 100. Thus, the power conversion device with excellent heat dissipation property securing the space for heat dissipation can be obtained.

Further, the power conversion device 1000D having the structure CtD can exhibit the effect similar to that exhibited by the first embodiment. Further, similarly to the power conversion device 1000, the power conversion device 1000D may have the above-described structure Ctxa.

Seventh Embodiment

The structure of the present embodiment is the structure characterized in the disposition of a plurality of semiconductor module pairs (hereinafter also referred to as the "structure CtE"). Hereinafter, the power conversion device having the structure CtE is also referred to as the "power conversion device 1000E". Similarly to the first embodiment, the power conversion device 1000E performs the above-described drive process Pr.

Figure 11A:
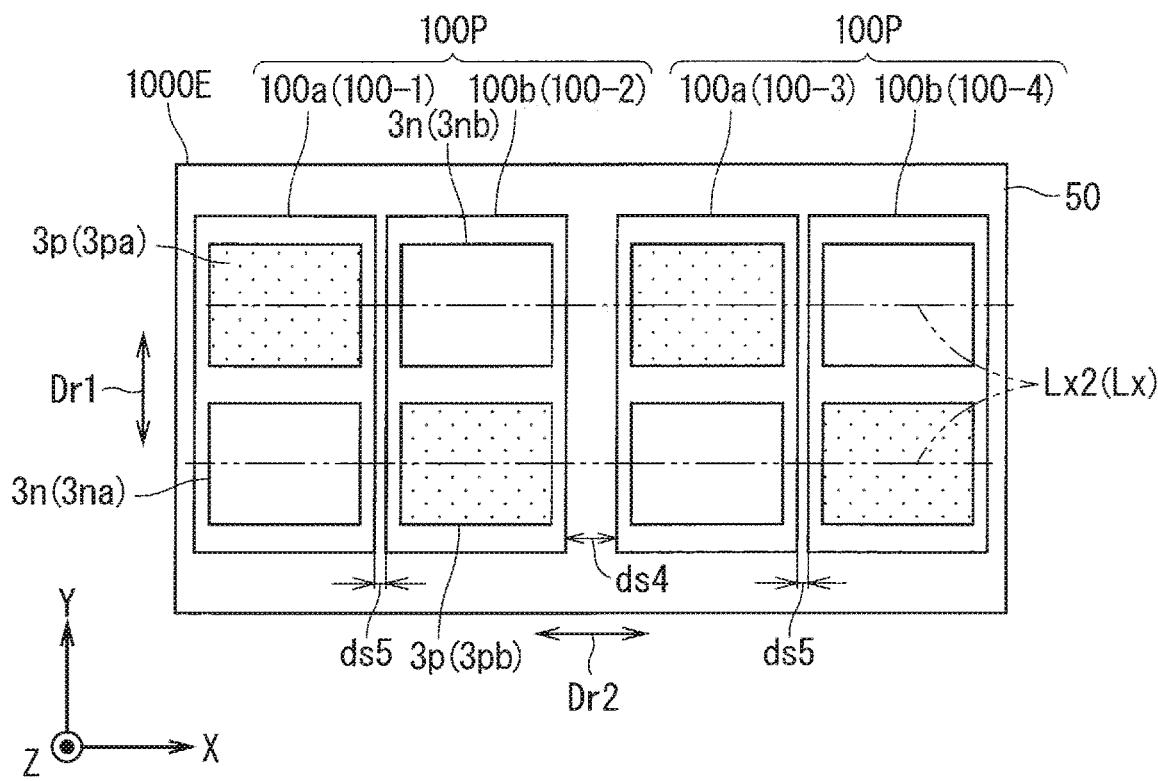
FIGS. 11A and 11B are illustrations for describing the structure of a power conversion device according to a seventh embodiment of the present invention.
Figure 11B:
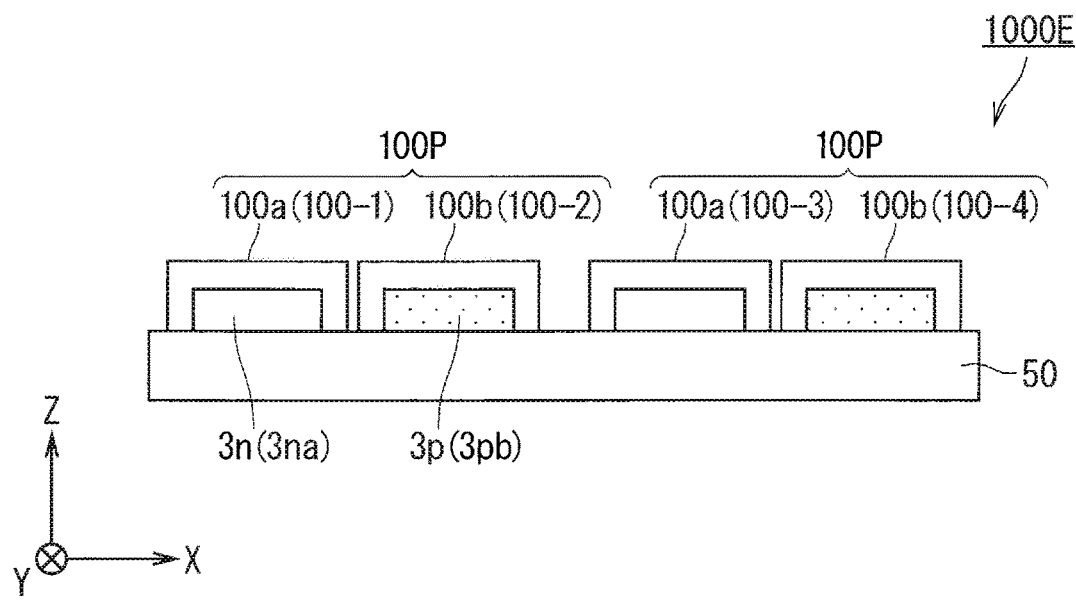

FIGS. 11A and 11B are illustrations for describing the structure of the power conversion device 1000E according to a seventh embodiment of the present invention. FIG. 11A is a plan view showing the disposition structure of the semiconductor module 100a and the semiconductor module 100b according to the seventh embodiment of the present invention. FIG. 11B is a cross-sectional view showing the disposition structure of the semiconductor module 100a and the semiconductor module 100b according to the seventh embodiment of the present invention.

The power conversion device 1000E includes k-pieces of semiconductor modules 100. In the present embodiment, "k" is an even number equal to or greater than 4. For example, "k" is 4. Note that, "k" is not limited to 4, and may be an even number greater than 4.

With reference to FIGS. 11A and 11B, the power conversion device 1000E is different from the power conversion device 1000 shown in FIGS. 5A and 5B in the disposition state of the k-pieces of semiconductor modules 100. The rest of the structure of the power conversion device 1000E is similar to that of the power conversion device 1000 and, therefore, the detailed description thereof will not be repeated.

Next, a detailed description will be given of the structure CtE. With reference to FIG. 11A, the power conversion device 1000E having the structure CtE includes u (an integer equal to or greater than 2)-pieces of semiconductor module pairs 100P structured by k-pieces of semiconductor modules 100. In the present embodiment, as an example, "u" is 2. The u-pieces of semiconductor module pairs include two semiconductor module pairs 100P adjacent to each other in the direction Dr2. Note that, "u" may be 3 or greater.

Each of the u-pieces of semiconductor module pairs 100P is structured by the semiconductor module 100a and the semiconductor module 100b.

Further, in the structure CtE, the semiconductor modules 100-1, 100-2, 100-3, 100-4 are parallel to one another in terms of their longitudinal direction (Dr1). That is, in each of the semiconductor module pairs 100P, the longitudinal direction (Dr1) of the semiconductor module 100a is parallel to the longitudinal direction (Dr1) of the semiconductor module 100b.

Further, in each of the semiconductor module pairs 100P, the P-side substrate 3p of the semiconductor module 100a and the N-side substrate 3n of the semiconductor module 100b are disposed linearly along the direction Dr2. Further, in each of the semiconductor module pairs 100P, the N-side substrate 3n of the semiconductor module 100a and the P-side substrate 3p of the semiconductor module 100b are disposed linearly along the direction Dr2.

Further, in the structure CtE, in each of the semiconductor module pairs 100P, the P-side substrate 3p of the semiconductor module 100a and the N-side substrate 3n of the semiconductor module 100b are disposed adjacent to each other along the crossing line segment Lx2. Further, in each of the semiconductor module pairs 100P, the N-side substrate 3n of the semiconductor module 100a and the P-side substrate 3p of the semiconductor module 100b are disposed adjacent to each other along the crossing line segment Lx2.

Hereinafter, the interval between two semiconductor module pairs 100P adjacent to each other in the direction Dr2 is also referred to as the "interval ds4" or "ds4". Further, hereinafter, the interval between the semiconductor module 100a and the semiconductor module 100b in each of the semiconductor module pairs 100P in the direction Dr2 is also referred to as the "interval ds5" or "ds5".

In the structure CtE, the interval ds4 is greater than the interval ds5.

As has been described above, in the present embodiment, the interval ds4 between adjacent two semiconductor module pairs 100P is greater than the interval ds5 between the semiconductor module 100a and the semiconductor module 100b. Accordingly, the space for heat dissipation can be secured in both ends of the semiconductor module pairs 100P in the direction Dr2.

Thus, it becomes possible to suppress interference between heat generated by the semiconductor module pairs 100P and heat generated by other semiconductor module pairs 100P in the drive process executing state. Thus, the power conversion device with excellent heat dissipation property securing the space for heat dissipation can be obtained.

Further, the power conversion device 1000E having the structure CtE can exhibit the effect similar to that exhibited by the first embodiment.

Note that, as to the present invention, the embodiments can be freely combined, modified, or omitted as appropriate without departing from the scope of the invention.

While the invention has been shown and described in detail, the foregoing description is in all aspects illustrative and not restrictive. It is therefore understood that numerous variations can be devised without departing from the scope of the invention.

EXPLANATION OF REFERENCE SIGNS 3n, 3na, 3nb: N-side substrate
3p, 3pa, 3pb: P-side substrate
11: semiconductor element
100, 100a, 100b, 100-1, 100-2, 100-3, 100-4: semiconductor module
1000, 1000A, 1000Ab, 1000B, 1000C, 1000D, 1000E: power conversion device
Cr1, Cr1a, Cr1b, Cr10, Cr100: circuit
Pw1: power supply
Tm1, Tm2, Tm3: terminal

The invention claimed is:
1. A power conversion device comprising:
k (an integer equal to or greater than 2)-pieces of semiconductor modules, wherein each of the k-pieces of semiconductor modules includes:
a housing;
a first member provided with a first circuit;
a second member provided with a second circuit; and
a base plate upon which the first member, the second member and the housing are mounted such that the first member and the second member are disposed within an opening in the housing, wherein
the first circuit and the second circuit are electrically connected to each other,
the first circuit does not drive when the second circuit is driving,
the second circuit does not drive when the first circuit is driving,
a shape of each of the housings and base plates of the semiconductor modules is elongated as seen in a plan view,
the first member and the second member of each of the semiconductor modules are disposed adjacent to each other along a first direction being a longitudinal direction of the semiconductor modules as seen in a plan view,
the k-pieces of semiconductor modules include a first semiconductor module and a second semiconductor module disposed adjacent to each other, such that the housing and the base plate of the first semiconductor module are spaced from the housing and the base plate of the second semiconductor module, and the first member of the first semiconductor module and the second member of the second semiconductor module are disposed adjacent to each other along a crossing line segment being a line segment crossing the first direction as seen in a plan view.

2. The power conversion device according to claim 1, wherein a longitudinal direction of the first semiconductor module is parallel to a longitudinal direction of the second semiconductor module, and the first member of the first semiconductor module and the second member of the second semiconductor module are disposed linearly along a second direction being perpendicular to the first direction as seen in a plan view.

3. The power conversion device according to claim 2, wherein k is an integer equal to or greater than 4, the k-pieces of semiconductor modules include a third semiconductor module and a fourth semiconductor module, the first semiconductor module, the second semiconductor module, the third semiconductor module, and the fourth semiconductor module are disposed adjacent to one another along the second direction in order of the first semiconductor module, the second semiconductor module, the third semiconductor module, and the fourth semiconductor module, a longitudinal direction of each of the third semiconductor module and the fourth semiconductor module is parallel to the longitudinal direction of the second semiconductor module, the second member of the second semiconductor module and the first member of the third semiconductor module are disposed linearly along the second direction, an interval between the second semiconductor module and the third semiconductor module in the second direction is greater than an interval between the first semiconductor module and the second semiconductor module in the second direction, and the interval between the second semiconductor module and the third semiconductor module in the second direction is greater than an interval between the third semiconductor module and the fourth semiconductor module in the second direction.

4. The power conversion device according to claim 1, wherein k is an integer equal to or greater than 3, each of the k-pieces of semiconductor modules includes a semiconductor element, the semiconductor element includes a first terminal, a second terminal, and a third terminal, a state of the semiconductor element includes an ON state where the first terminal and the second terminal of the semiconductor element are electrically connected to each other, and an OFF state where the first terminal and the second terminal of the semiconductor element are not electrically connected to each other, the third terminal is a terminal for being selectively applied with an ON voltage being voltage for causing the semiconductor element to enter the ON state, and an OFF voltage being voltage for causing the semiconductor element to enter the OFF state, the power conversion device further comprises a power supply, the third terminal of each of the semiconductor modules is provided at an end in a longitudinal direction of the semiconductor module as seen in a plan view, the k-pieces of semiconductor modules include a power supply proximity module being a semiconductor module having the third terminal positioned closest to the power supply out of the k-pieces of semiconductor modules, the power supply proximity module is the second semiconductor module, the k-pieces of semiconductor modules include (k−1)-pieces of power supply non-proximity modules each being a semiconductor module not corresponding to the power supply proximity module, each of the (k−1)-pieces of power supply non-proximity modules is the first semiconductor module, the power supply proximity module and the (k−1)-pieces of power supply non-proximity modules are disposed adjacent to each other along a second direction being perpendicular to the first direction as seen in a plan view, a longitudinal direction of each of the power supply non-proximity modules is parallel to a longitudinal direction of the power supply proximity module, and the first member of each of the power supply non-proximity modules and the second member of the power supply proximity module are disposed linearly along the second direction.

5. The power conversion device according to claim 1, wherein a longitudinal direction of the first semiconductor module is parallel to a longitudinal direction of the second semiconductor module, a shape of the crossing line segment is zigzag, and the first member of the first semiconductor module and the second member of the second semiconductor module are disposed adjacent to each other along the crossing line segment.

6. The power conversion device according to claim 5, wherein k is an integer equal to or greater than 4, the k-pieces of semiconductor modules include a third semiconductor module and a fourth semiconductor module, the first semiconductor module, the second semiconductor module, the third semiconductor module, and the fourth semiconductor module are disposed adjacent to one another along a second direction being perpendicular to the first direction as seen in a plan view in order of the first semiconductor module, the second semiconductor module, the third semiconductor module, and the fourth semiconductor module, a longitudinal direction of each of the third semiconductor module and the fourth semiconductor module is parallel to a longitudinal direction of the second semiconductor module, the first member of the first semiconductor module, the second member of the second semiconductor module, the first member of the third semiconductor module, and the second member of the fourth semiconductor module are disposed adjacent to one another along the crossing line segment, an interval between the second semiconductor module and the third semiconductor module in the second direction is greater than an interval between the first semiconductor module and the second semiconductor module in the second direction, and the interval between the second semiconductor module and the third semiconductor module in the second direction is greater than an interval between the third semiconductor module and the fourth semiconductor module in the second direction.

7. The power conversion device according to claim 1, wherein k is an even number equal to or greater than 4, the power conversion device comprises u (an integer equal to or greater than 2)-pieces of semiconductor module pairs structured by the k-pieces of semiconductor modules, each of the u-pieces of semiconductor module pairs is structured by the first semiconductor module and the second semiconductor module, a longitudinal direction of the first semiconductor module is parallel to a longitudinal direction of the second semiconductor module, the first member of the first semiconductor module and the second member of the second semiconductor module are disposed linearly along a second direction being perpendicular to the first direction as seen in a plan view, the u-pieces of semiconductor module pairs include two semiconductor module pairs being adjacent to each other in the second direction, an interval between the two semiconductor module pairs being adjacent to each other in the second direction is greater than an interval between the first semiconductor module and the second semiconductor module in each of the semiconductor module pairs in the second direction.

8. The power conversion device according to claim 1, wherein a longitudinal direction of the first semiconductor module crosses a longitudinal direction of the second semiconductor module, a shape of the crossing line segment is elliptic arc-like, and the first member of the first semiconductor module and the second member of the second semiconductor module are disposed adjacent to each other along the crossing line segment being elliptic arc-like.

9. A power conversion device comprising k (an integer equal to or greater than 2)-pieces of semiconductor modules, wherein each of the k-pieces of semiconductor modules includes:

a first member provided with a first circuit; and a second member provided with a second circuit, wherein the first circuit and the second circuit are electrically connected to each other, the first circuit does not drive when the second circuit is driving, the second circuit does not drive when the first circuit is driving, a shape of each of the semiconductor modules is elongated as seen in a plan view, the first member and the second member of each of the semiconductor modules are disposed adjacent to each other along a first direction being a longitudinal direction of the semiconductor modules as seen in a plan view, the k-pieces of semiconductor modules include a first semiconductor module and a second semiconductor module disposed adjacent to each other, the first member of the first semiconductor module and the second member of the second semiconductor module are disposed adjacent to each other along a crossing line segment being a line segment crossing the first direction as seen in a plan view, a longitudinal direction of the first semiconductor module crosses a longitudinal direction of the second semiconductor module, a shape of the crossing line segment is elliptic arc-like, and the first member of the first semiconductor module and the second member of the second semiconductor module are disposed adjacent to each other along the crossing line segment being elliptic arc-like.

* * * * *